(12) United States Patent
Fujii et al.

(10) Patent No.: US 8,771,920 B2
(45) Date of Patent: Jul. 8, 2014

(54) LITHOGRAPHIC PRINTING PLATE PRECURSOR AND METHOD OF PREPARING THE SAME

(75) Inventors: Shigekatsu Fujii, Haibara-gun (JP); Norio Aoshima, Haibara-gun (JP); Yoshinori Taguchi, Haibara-gun (JP); Yoichiro Ara, Haibara-gun (JP); Takashi Aridomi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/408,408

(22) Filed: Feb. 29, 2012

(65) Prior Publication Data

US 2012/0251954 A1    Oct. 4, 2012

(30) Foreign Application Priority Data

Mar. 31, 2011  (JP) ................. 2011-081065
Mar. 31, 2011  (JP) ................. 2011-081066
Mar. 31, 2011  (JP) ................. 2011-081067
Jan. 30, 2012  (JP) ................. 2012-016694
Jan. 31, 2012  (JP) ................. 2012-018134

(51) Int. Cl.
*B41M 5/00* (2006.01)
*B41N 1/00* (2006.01)
*G03F 7/00* (2006.01)
*G03F 7/26* (2006.01)
*B41F 7/00* (2006.01)

(52) U.S. Cl.
USPC ............ 430/270.1; 430/282.1; 430/294; 430/302; 430/329; 430/434; 101/450.1; 101/453; 101/463.1

(58) Field of Classification Search
USPC .......... 430/270.1, 302; 101/450.1, 453, 463.1
See application file for complete search history.

(56) References Cited

U.S. PATENT DOCUMENTS

| 2005/0214678 A1* | 9/2005 | Nagashima ............... 430/270.1 |
| 2008/0254384 A1* | 10/2008 | Iwai ........................ 430/281.1 |
| 2011/0217656 A1* | 9/2011 | Taguchi et al. ........... 430/270.1 |

FOREIGN PATENT DOCUMENTS

| EP | 1522417 A1 | 4/2005 |
| EP | 1627732 A1 * | 2/2006 |
| EP | 2293144 A1 | 3/2011 |
| EP | 2357530 A2 | 8/2011 |
| EP | 2365389 A1 | 9/2011 |
| JP | 2000131828 A | 5/2000 |
| JP | 2003186188 A | 7/2003 |
| JP | 2004233759 A | 8/2004 |
| JP | 2004240272 A | 8/2004 |
| JP | 2004272182 A | 9/2004 |
| JP | 2004276455 A | 10/2004 |

(Continued)

OTHER PUBLICATIONS

Extended European Search Report dated Oct. 10, 2012 for corresponding European Patent Application No. 12 15 7456.

(Continued)

*Primary Examiner* — Chanceity Robinson
(74) *Attorney, Agent, or Firm* — Sughrue Mion, PLLC

(57) ABSTRACT

A lithographic printing plate precursor in a positive-type with an infrared-sensitivity, having a support and an image recording layer provided on the support, the support having a hydrophilic surface, the recording layer having a particular resin, an amphoteric surfactant and/or an anionic surfactant, and an infrared absorbing agent, wherein the particular resin being at least one of resins selected from the group consisting of a polyurethane resin, a poly (vinyl acetal) resin, and maleimide resin A.

11 Claims, 1 Drawing Sheet

(56) References Cited

FOREIGN PATENT DOCUMENTS

| | | | |
|---|---|---|---|
| JP | 2004354402 | A | 12/2004 |
| JP | 2007-017913 | A | 1/2007 |
| JP | 2010-532488 | A | 10/2010 |
| JP | 4579639 | B2 | 11/2010 |
| WO | 2007017162 | A2 | 2/2007 |

OTHER PUBLICATIONS

Japanese Patent Office, "Decision to Grant a Patent," issued in connection with Japanese Patent Application No. 2011-081066, dated Sep. 10, 2013.

* cited by examiner

LITHOGRAPHIC PRINTING PLATE PRECURSOR AND METHOD OF PREPARING THE SAME

FIELD OF THE INVENTION

The present invention relates to a lithographic printing plate precursor and a method of preparing the lithographic printing plate precursor.

BACKGROUND OF THE INVENTION

The progress has astonishingly been made, in the technology relating to laser exposure and development of lithographic printing. Especially, it can be noted that a high power and compact device has been available, without difficulties, for the solid laser and the semiconductor laser each of which has an emitting region in the range of from near-infrared to infrared. These lasers are extremely useful as an exposure source, for making a plate directly from digital data of a computer and the like. Accordingly, it is extremely important to develop a lithographic printing plate precursor that properly copes with this type of the plate making.

The recording layer of a positive type lithographic printing plate precursor for infrared laser contains, as essential components, an alkali-soluble binder resin and an IR dye or the like that absorbs light to generate heat. This IR dye or the like in the unexposed area (image area) acts as a development inhibitor that substantially reduces solubility with respect to a developing solution for the binder resin due to interaction with the binder resin. Meanwhile, in the exposed area (non-image area), an interaction between the IR dye or the like and the binder resin is weakened due to the generated heat, and the binder resin is dissolved in an alkali developing solution to form a lithographic printing plate.

The basic performance required for the lithographic printing plate precursor includes developability that rapidly realizes formation of a vivid image area, and in contrast, chemical resistance by which the recording layer in the unexposed area is accurately retained without being dissolved, and improvement in plate durability that increases print capacity. However, these performances are generally conflicting. Accordingly, it is extremely difficult to improve all the performances at the same time. For example, in JP-A-2007-017913 ("JP-A" means an unexamined publication of Japanese patent application), Japanese Patent No. 4579639 and JP-T-2010-532488 ("JP-T" means published Japanese translation of PCT application), incorporation of a particular polymer into a recording layer of the printing plate precursor disclosed therein has been proposed.

Normally, when a polymer having a large molecular weight is incorporated in a recording layer, improvement in plate durability and chemical resistance in accordance with it can be expected. However, that tends to reduce developability. As a result, it is difficult to improve all the performances with a balanced manner.

SUMMARY OF THE INVENTION

A lithographic printing plate precursor in a positive-type with an infrared-sensitivity, having a support and an image recording layer provided on the support, the support having a hydrophilic surface, the recording layer having:
a particular resin;
an amphoteric surfactant and/or an anionic surfactant; and
an infrared absorbing agent;
the particular resin being at least one of resins selected from the group consisting of a polyurethane resin, a poly(vinyl acetal) resin, and maleimide resin A.

Other and further features and advantages of the invention will appear more fully from the following description, appropriately referring to the accompanying drawing.

EXPLANATION OF SYMBOLS

Figure 1:
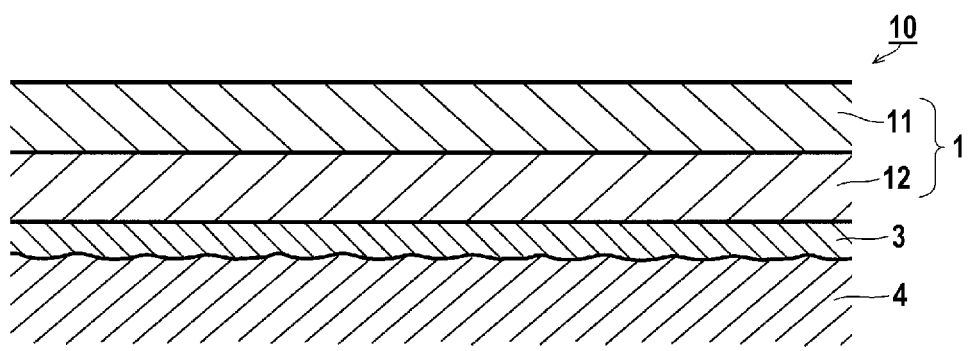
FIG. 1 is a sectional view schematically showing an embodiment in which a lithographic printing plate precursor of the present invention has a multilayer structure as a recording layer.
Figure 2:
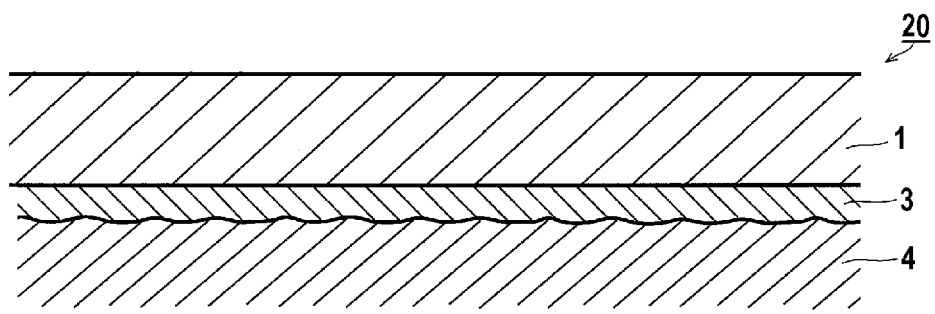
FIG. 2 is a sectional view schematically showing an embodiment in which a lithographic printing plate precursor of the present invention has a single layer structure as a recording layer.

1: image recording layer
3: undercoat layer
4: support
11: upper layer of the recording layer
12: lower layer of the recording layer
10 and 20: lithographic printing plate precursor

DETAILED DESCRIPTION OF THE INVENTION

As a method of enhancing developability of a polymer having an inferior in that, a method of adding a surfactant to a developing solution is known. Generally, in the processing of the positive type lithographic printing plate precursor for infrared laser, it is necessary to stabilize the liquid activity in order to perform a processing continuously and stably. The liquid activity is controlled by an alkali concentration (pH, conductivity, etc.). However, in a case where a surfactant is added to a developing solution, a continuous use of the developing solution makes it difficult to keep a concentration of the surfactant constant. As a result, the concentration of the surfactant gradually becomes thicker, which sometimes results in reduction of chemical resistance. On the contrary, when the concentration of the surfactant becomes thinner, that sometimes results in reduction of develop ability.

In view of the techniques disclosed by the above-described patent literatures, the present invention addresses provision of a lithographic printing plate precursor that realizes both high plate durability and high chemical resistance in the lithographic printing, with good developability in the exposed area, suppression of a running residue (hereinafter also referred to as "developing residue), and a good concentration performance of a developing waste liquid.

As a result of intensive studies in view of achieving the above subjects, the present inventors have found the following knowledge. That is, the presence of both a particular polymer and a particular surfactant in a recording layer of a positive type lithographic printing plate precursor for infrared laser makes it possible for the surfactant to be stably supplied to the developing system. This leads to realization of a high degree of plate durability, and also achievement of good developability in the exposed area. The present invention has been made on the basis of the above new findings.

According to the present invention, there are provided the following means:
<1> A lithographic printing plate precursor in a positive-type with an infrared-sensitivity, having a support and an image recording layer provided on the support, the support having a hydrophilic surface, the recording layer comprising:
  a particular resin;
  an amphoteric surfactant and/or an anionic surfactant; and
  an infrared absorbing agent;
  the particular resin being at least one of resins selected from the group consisting of a polyurethane resin, a poly(vinyl acetal) resin, and maleimide resin A;
  the maleimide A being a copolymer formed from monomers containing:
  methacrylic acid;
  at least one kind of compound selected from the group consisting of N-phenylmaleimide, N-cyclohexylmaleimide and N-benzylmaleimide; and
  a monomer having a structure represented by formula (A):

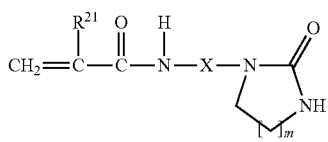
(A)

In formula (A), $R^{21}$ represents a hydrogen atom or a methyl group; X represents an alkylene group having 2 to 12 carbon atoms, an oxyalkylene group having 4 to 8 carbon atoms or —SiRa$_2$—; Ra represents an alkyl group and the two (2) alkyl groups represented by Ra may be the same as or different from each other; and m represents an integer of 1 to 3.

<2> The lithographic printing plate precursor described in the above item <1>, wherein the image recording layer has a configuration in which a lower layer on the side of the support and an upper layer on the side opposite thereto are disposed on the support in this order, the upper layer and/or the lower layer comprising the particular resin, the amphoteric surfactant and/or the anionic surfactant, and the infrared absorbing agent in the same layer, or in a separate layer.

<3> The lithographic printing plate precursor described in the above item <1> or <2>, wherein the amphoteric surfactant is represented by any one of formulae (I) to (III):

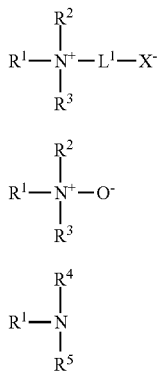

In formulae (I) to (III), $R^1$ represents an alkyl group having 6 to 24 carbon atoms or an alkyl group through a particular connecting group; $R^2$ and $R^3$ each independently represent an alkyl group having 1 to 5 carbon atoms; $R^4$ and $R^5$ each independently represent an alkyl group having 1 to 5 carbon atoms, and at least one of $R^4$ and $R^5$ contains an acidic group or a salt thereof at the end of the alkyl group; $L^1$ represents a linking group having 1 to 4 carbon atoms; and $X^-$ represents a carboxylate ion, a sulfonate ion, a sulfate ion or a phosphate ion.

<4> The lithographic printing plate precursor described in the above item <1> or <2>, wherein the anionic surfactant is represented by any one of formulae (IV) to (VII):

$$R^6—L^{12}—D^1 \qquad (IV)$$

$$R^7—L^{13}—E^1 \qquad (V)$$

$$R^8—L^{14}—F^1 \qquad (VI)$$

$$R^9—L^{15}—G^1—L^6 \qquad (VII)$$

In formulae (IV) to (VII), $R^6$ and $R^9$ each represent an alkyl group having 6 to 24 carbon atoms; $L^2$ represents a phenylene group or a single bond; $D^1$, $E^1$ and $F^1$ each represent an sulfonate ion or a salt thereof, or an phosphate ion or a salt thereof; $R^7$ represents an alkyl group having 4 to 18 carbon atoms; $L^3$ represents a phenylene group or a naphthylene group; $R^8$ represents a phenyl group or a naphthyl group; $L^4$ represents a polyalkyleneoxy group; $L^5$ represents a phenylene group; $G^1$ represents an oxygen atom; and $L^6$ represents a phenyl group.

<5> The lithographic printing plate precursor described in any one of the above items <1> to <4>, wherein the polyurethane resin is a polymerization product of at least a diisocyanate compound selected from the following DI-1 to DI-4 and a diol compound selected from the following DO-1 to DO-5.

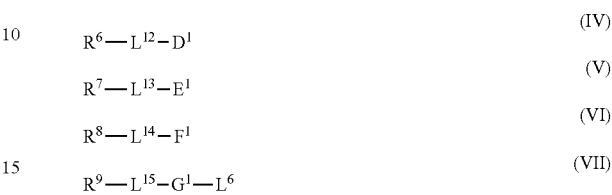

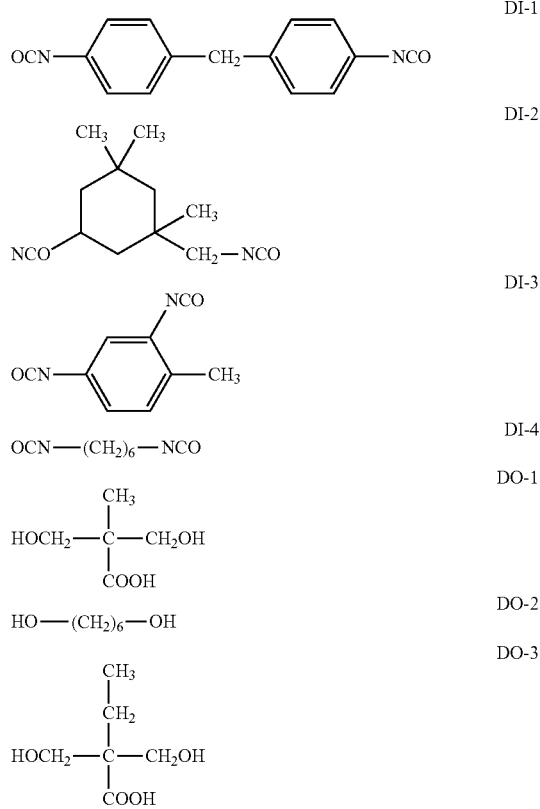

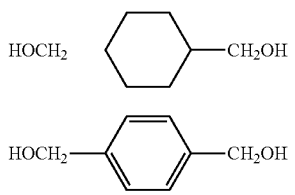

<6> The lithographic printing plate precursor described in any one of the above items <1> to <5>, wherein a recurring unit of the poly (vinyl acetal) is represented by the following formula (a):

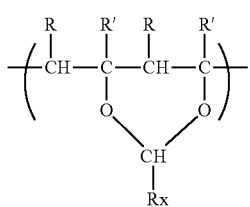

In formula (a), R and R' each independently represent a hydrogen atom, an alkyl group or a halogen atom; and Rx represents a phenol group, a naphthol group or an anthracenol group.
<7> The lithographic printing plate precursor described in any one of the above items <1> to <6>, wherein a recurring unit of the poly (vinyl acetal) is represented by the following formula (b):

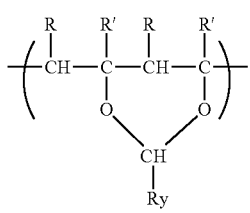

In formula (b), R and R' each independently represent a hydrogen atom, an alkyl group or a halogen atom; Ry represents any one of the following $R_1$, $R_2$ or $R_3$, and the resin represented by formula (b) is a copolymer comprising at least two recurring units that are different from each other in terms of the above-described Ry;
wherein $R_1$ is an alkyl group, a cycloalkyl group, or an aryl group other than a phenol group or a naphthol group;
wherein $R_2$ has the same meaning as that of Rx; and
wherein $R_3$ is an alkynyl group having 2 to 4 carbon atoms or a phenyl group.
<8> The lithographic printing plate precursor described in any one of the above items <1> to <7>, wherein the surfactant is contained in an amount of 1% by mass or more and less than 20% by mass with respect to the total amount of the solid content of the layer containing the same, and the surfactant and the infrared absorbing agent are contained in the same layer, or in a separate layer.
<9> The lithographic printing plate precursor described in any one of the above items <1> to <8>, wherein the surfactant is contained in an amount of from 0.5% by mass to 40% by mass with respect to 100% by mass of the particular resin.
<10> The lithographic printing plate precursor described in any one of the above items <1> to <9>, wherein the lithographic printing plate precursor has an undercoat layer, a lower layer for forming the recording layer and an upper layer for forming the recording layer in this order as layers on the support.
<11> The lithographic printing plate precursor described in any one of the above items <1> to <10>, wherein the polyurethane resin is contained in the upper layer of the recording layer.
<12> The lithographic printing plate precursor described in any one of the above items <1> to <11>, wherein the maleimide resin A is contained in the lower layer of the recording layer.
<13> The lithographic printing plate precursor described in any one of the above items <1> to <12>, wherein the surfactant is contained in the same layer as the layer containing the particular resin.
<14> A method of making a lithographic printing plate, comprising, in the following order:
subjecting the recording layer of the lithographic printing plate precursor described in any one of the above items <1> to <13> to image-wise exposure; and
developing the lithographic printing plate precursor using an alkaline aqueous solution which has a pH of from 11.0 to 13.5.
<15> The method of making a lithographic printing plate described in the above item <14>, wherein the aqueous alkali solution comprises an anionic surfactant or a nonionic surfactant.

Details of the present invention are described below.
<Lithographic Printing Plate Precursor>

The lithographic printing plate precursor of the present invention has an image recording layer above the support having a hydrophilic surface, the image recording layer containing a particular resin (a), and a particular surfactant (b). When the recording layer is separated into a lower layer and an upper layer, the components (a) and (b) may be added to the upper layer or the lower layer, and each of them may be added to the same layer, or may be added to the separate layers. The lower layer and the upper layer are disposed above the support in this order. If needed, other layers, for example, optional layers such as an undercoat layer or a protective layer, may be further present above the support. In the present invention, it is preferable from the viewpoint of effect that the lower layer and the upper layer are formed adjacent to each other.

The reason (mechanism of action) to produce the effect of simultaneous achievement of plate durability, chemical resistance and developability due to the use of the above configuration in the present invention includes unexplained points. However, the reason is presumed as follows. That is, the amphoteric surfactant and the anionic surfactant have higher hydration force and dispersion force than the nonionic or cationic surfactant. Accordingly, it is assumed that addition of the amphoteric surfactant or the anionic surfactant to the recording layer produces high effects in a smaller amount than the nonionic or cationic surfactant. As a result, it seems that a desirable effect may be produced in combination with the action of the above-described particular polymer without reducing chemical resistance and the like of the recording layer. Preferable embodiments of the present invention are described below by sectionalizing into a first embodiment, a second embodiment and a third embodiment in terms of type of the resin.

<Particular Resin>

Polyurethane Resin

First Embodiment

The image recording layer constituting the lithographic printing plate precursor of the present invention contains a polyurethane which has a substituent having an acidic hydrogen atom. The acidic hydrogen atom may belong to an acidic functional group such as a carboxyl group, —$SO_2NHCOO$— group, —$CONHSO_2$— group, —$CONHSO_2NH$— group or —$NHCONHSO_2$— group, but is particularly preferably derived from a carboxyl group.

The polyurethane having an acidic hydrogen atom can be synthesized by a method of reacting a diol having a carboxyl group and, if necessary, another diol and a diisocyanate; a method of reacting a diol, a diisocyanate having a carboxyl group and, if necessary, another diisocyanate; or a method of reacting a diol having a carboxyl group and, if necessary, another diol, a diisocyanate having a carboxyl group and, if necessary, another diisocyanate.

Examples of the diol having a carboxyl group include 3,5-dihydroxybenzoic acid, 2,2-bis(hydroxymethyl)propionic acid, 2,2-bis(hydroxyethyl)propionic acid, 2,2-bis(3-hydroxypropyl)propionic acid, 2,2-bis(hydroxymethyl)acetic acid, bis-(4-hydroxyphenyl)acetic acid, 4,4-bis-(4-hydroxyphenyl)pentanoic acid and tartaric acid, and 2,2-bis(hydroxymethyl)propionic acid is more preferable in view of reactivity with isocyanate.

Examples of the other diol include dimethylolpropane, polypropylene glycol, neopentyl glycol, 1,3-propanediol, polytetramethylene ether glycol, polyesterpolyol, polymerpolyol, polycaprolactonepolyol, polycarbonatediol, 1,4-butanediol, 1,5-pentadiol, 1,6-hexanediol and polybutadienepolyol.

Examples of the diisocyanate having a carboxyl group include dimer acid diisocyanate.

Examples of the other diisocyanate include 4,4'-diphenylmethane diisocyanate, xylylene diisocyanate, naphthylene-1,5-diisocyanate, tetramethylxylene diisocyanate, hexamethylene diisocyanate, toluene-2,4-diisocyanate, isophorone diisocyanate, hydrogenated xylylene diisocyanate, dicyclohexylmethane diisocyanate, norbornane diisocyanate and trimethylhexamethylene diisocyanate.

The molar ratio of the diisocyanate to the diol is preferably from 0.7:1 to 1.5:1. In case an isocyanate group remains at the end of the polymer, by treating the isocyanate with alcohols or amines, synthesis is finally conducted without remaining the isocyanate group.

The weight average molecular weight of the above-described particular polyurethane is preferably within a range from 2,000 to 100,000. When the weight average molecular weight of the polyurethane is less than 2,000, the image area obtained by forming images tends to be insufficient in durability, resulting in poor printing durability. On the other hand, when the weight average molecular weight of the polyurethane is more than 100,000, developability and sensitivity tends to be poor.

The above-described particular polyurethane is preferably alkali soluble or dispersible.

The content of the particular polyurethane in the recording layer is preferably within a range from 2 to 90% by mass, more preferably within a range from 50 to 90% by mass, based on the total solid content of the layer containing the polyurethane. It is advantageous from the viewpoint of plate durability that the content of the particular polyurethane is not less than the above-described lower limit. It is advantageous from the viewpoint of developability that the content of the particular polyurethane is not more than the above-described upper limit. If necessary, two or more kinds of the particular polyurethanes may be used in combination.

Maleimide Resin A

Second Embodiment

One of the resins used in the upper layer and/or the lower layer of the image recording layer is a copolymer containing, as monomer components, methacrylic acid, a particular maleimide compound (at least one selected from the group consisting of N-phenylmaleimide, N-cyclohexylmaleimide and N-benzylmaleimide) and a monomer having a particular nitrogen-containing hetero ring (a monomer represented by formula (A) described below). The content of methacrylic acid is preferably from about 5% by mole to about 40% by mole, and more preferably from about 10% by mole to about 30% by mole (in this specification, when a range of from a to b is used, the range means to include a and b). The content of the particular maleimide compound is preferably from about 20% by mole to about 75% by mole, and more preferably from about 35% by mole to about 60% by mole. In the case where optional components are present, the resin may contain acrylamide, methacrylamide, or a mixture thereof in an amount of preferably from about 5% by mole to about 50% by mole, and more preferably from about 15% by mole to about 40% by mole. Further in the case where optional components are present, the resin may contain acrylonitrile, methacrylonitrile, or a mixture thereof in an amount of preferably from about 10% by mole to about 70% by mole, and more preferably from about 20% by mole to about 60% by mole. Further, the resin may contain the monomer having a particular nitrogen-containing hetero ring represented by the following formula (A) in an amount of preferably from about 3% by mole to about 50% by mole, and more preferably from about 10% by mole to about 40% by mole.

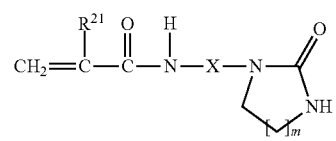

(A)

In formula (A), $R^{21}$ represents a hydrogen atom or a methyl group. X represents an alkylene group having 2 to 12 carbon atoms, an oxyalkylene group having 4 to 8 carbon atoms or —$SiRa_2$—. Ra represents an alkyl group and the two (2) alkyl groups represented by Ra may be the same as or different from each other. m represents an integer of 1 to 3. X is preferably —$CH_2CH_2$—. m is preferably 1.

A preferred monomer for the preparation of the copolymer is N-[2-(2-oxo-1-imidazolidinyl)ethyl]methacrylamide, in which $R^1$ is $CH_3$, m is 1, X is —$(CH_2)_n$—, and n is 2. This monomer is represented by the structure:

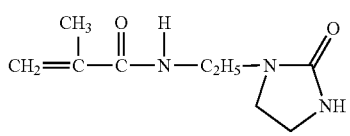

The above-described compounds may be prepared by ordinary methods. For example, N-[2-(2-oxo-1-imidazolidinyl)ethyl]methacrylamide, which may be prepared from aminoethyl ethyleneurea and methacrylic acid, is available from Aldrich Chemical company, Inc., Milwaukee, Wis., USA.

The content of the particular maleimide resin A in the present invention is not particularly limited, but preferably from 2% by mass to 90% by mass, and more preferably from 50% by mass to 90% by mass, with respect to the total solid content of the recording layer. Favorable plate durability may be obtained by setting the content of the particular maleimide resin A not less than the above-described lower limit. Meanwhile, favorable developability may be obtained by setting the content of the particular maleimide resin A not more than the above-described upper limit.

(Other Resin)

The upper layer and/or the lower layer may also contain a resin or resins having activated methylol and/or activated alkylated methylol groups. Such resins include, for example: resol resins and their alkylated analogs; methylol melamine resins and their alkylated analogs, for example, melamine-formaldehyde resins; methylol glycoluril resins and alkylated analogs, for example, glycoluril-formaldehyde resins; thiourea-formaldehyde resins; guanamine-formaldehyde resins; and benzoguanamine-formaldehyde resins. Commercially available melamine-formaldehyde resins and glycoluril-formaldehyde resins include, for example, CYMEL (trade name) resins (Dyno Cyanamid) and NIKALAC (trade name) resins (Sanwa Chemical).

The resin or resins having activated methylol and/or activated alkylated methylol groups is preferably a resol resin or a mixture of resol resins. Resol resins are well known to those skilled in the art. They are prepared by reaction of a phenol with an aldehyde under basic conditions using an excess of phenol. Commercially available resol resins include, for example, GP649D99 resol (Georgia Pacific) and BKS-5928 resol resin (Union Carbide).

Additionally, the upper layer and/or the lower layer may contain a first added copolymer. The first added copolymer contains, in polymerized form, about 1% by mass to about 30% by mass, preferably about 3% by mass to about 20% by mass, more preferably about 5% by mass of N-phenylmaleimide; about 1% by mass to about 30% by mass, preferably about 5% by mass to about 20% by mass, more preferably about 10% by mass of methacrylamide, about 20% by mass to about 75% by mass, preferably about 35% by mass to about 60% by mass of acrylonitrile and about 20% by mass to about 75% by mass, preferably about 35% by mass to about 60% by mass of one or more monomers of the structure:

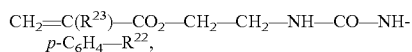

in which $R^{22}$ is OH, COOH, or $SO_2NH_2$; and $R^{23}$ is H or methyl; and, optionally, about 1% by mass to about 30% by mass, preferably, when present, about 3% by mass to about 20% by mass of one or more monomers of the structure:

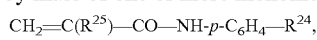

in which $R^{24}$ is OH, COOH, or $SO_2NH_2$; and $R^{25}$ is H or methyl.

Additionally, the upper layer and/or the lower layer may also contain a second added copolymer. The second added copolymer contains, in polymerized form, N-phenylmaleimide, methacrylamide, and methacrylic acid. These copolymers contain about 25 to about 75 mole %, preferably about 35 to about 60 mole % of N-phenylmaleimide; about 10 to about 50 mole %, preferably about 15 to about 40 mole % of methacrylamide; and about 5 to about 30 mole %, preferably about 10 to about 30 mole %, of methacrylic acid. These copolymers are disclosed in Shimazu, U.S. Pat. No. 6,294,311, and Savariar-Hauck, U.S. Pat. No. 6,528,228.

The maleimide resin and the added copolymers can be prepared by methods, such as free radical polymerization, which are well known to those skilled in the art and which are described, for example, in Chapters 20 and 21, of Macromolecules, Vol. 2, 2nd Ed., H. G. Elias, Plenum, New York, 1984. Useful free radical initiators are peroxides such as benzoyl peroxide, hydroperoxides such as cumyl hydroperoxide and azo compounds such as 2,2'-azobis(isobutyronitrile) (AIBN). Suitable solvents include liquids that are inert to the reactants and which will not otherwise adversely affect the reaction. Typical solvents include, for example, esters such as ethyl acetate and butyl acetate; ketones such as methyl ethyl ketone, methyl isobutyl ketone, methyl propyl ketone, and acetone; alcohols such as methanol, ethanol, isopropyl alcohol, and butanol; ethers such as dioxane and tetrahydrofuran, and mixtures thereof.

The content of the other resin in the present invention is not particularly limited, but preferably from 20% by mass to 95% by mass, and more preferably from 50% by mass to 90% by mass, with respect to the total solid content of the recording layer.

Acetal Resin

Third Embodiment

The recording layer constituting the lithographic printing plate precursor of the present embodiment contains an acetal resin.

Examples of the acetal resin that can be suitably used in the present embodiment include available poly (vinylacetals) that are exemplified by the resins in which at least 50% by mole (from 50% by mole to 70% by mole, more typically at least 60% by mole) of the recurring unit are acetal-containing recurring units. In contrast, the non-acetal-containing recurring units may also have the same or different pendant phenolic groups, or they may be recurring units having no pendant phenolic groups, or they may contain both types of recurring units. For example, the poly (vinyl acetal) could also include recurring units containing an itaconic acid or crotonic acid group. In addition, if there are recurring units containing pendant phenolic groups, those recurring units can have different pendant phenolic groups [for example, a poly (vinyl acetal) could have acetal-containing recurring units, and two or more different types of recurring units with different pendant phenolic groups].

In still other embodiments, a small molar amount (less than 20 mole %) of the acetal groups in a poly(vinyl acetal) can be reacted with a cyclic anhydride or isocyanate compound, such as toluene sulfonyl isocyanate.

Examples of the poly (vinylacetals) in the present embodiment include a compound containing a recurring unit represented by the following formula (a).

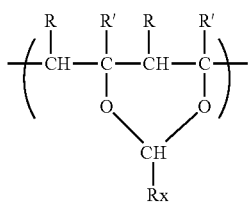

(a)

In formula (a), R and R' each independently represent a hydrogen atom, an alkyl group or a halogen atom. Rx represents a phenol group (hydroxyphenyl group), a naphthol group (hydroxynaphthyl group) or an anthracenol group (hydroxyanthracenyl group).

In formula (a), R and R' are preferably a hydrogen atom, or a substituted or unsubstituted linear or branched alkyl group having 1 to 6 carbon atoms (such as methyl, ethyl, n-propyl, n-butyl, n-pentyl, n-hexyl, chloromethyl, trichloromethyl, iso-propyl, iso-butyl, t-butyl, iso-pentyl, neo-pentyl, 1-methylbutyl and iso-hexyl groups), or substituted or unsubstituted cycloalkyl ring having 3 to 6 carbon atoms in the ring (such as cyclopropyl, cyclobutyl, cyclopentyl, methyl cyclohexyl, and cyclohexyl groups), or a halo group (such as fluoro, chloro, bromo, or iodo). Typically, R and R' are independently a hydrogen atom, or a substituted or unsubstituted methyl or chloro group, or for example, they are independently a hydrogen atom or unsubstituted methyl.

Rx is preferably a substituted or unsubstituted phenol, a substituted or unsubstituted naphthol, or a substituted or unsubstituted anthracenol group. These phenol, naphthol and anthracenol groups can have optionally up to 3 additional substituents including additional hydroxy substituents, methoxy, alkoxy, aryloxy, thioaryloxy, halomethyl, trihalomethyl, halo, nitro, azo, thiohydroxy, thioalkoxy, cyano, amino, carboxy, ethenyl, carboxyalkyl, phenyl, alkyl, alkenyl, alkynyl, cycloalkyl, aryl, heteroaryl, and heteroalicyclic groups. For example, Rx can be an unsubstituted phenol or naphthol group such as a 2-hydroxyphenyl or a hydroxynaphthyl group.

The above additional substituents of Rx may be substituted to the acetal carbon atom of formula (a) through arbitrary linking groups (for example, alkylene group having 1 to 3 carbon atoms).

Thus, the poly(vinyl acetals) can have a variety of other recurring units besides those represented by formula (a), but generally, at least 50 mole % of the recurring units are the same or different recurring units represented by formula (a).

More preferred examples of the poly(vinyl acetals) include ones containing a recurring unit represented by the following formula (b).

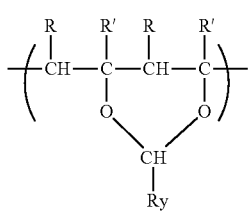

(b)

In formula (b), R and R' each have the same meaning as those in formula (a).

The polymerization ratio "m" of Monomer (Ia) in which Ry is equal to $R_1$ is preferably from 5% by mole to 40% by mole, and more preferably from 15% by mole to 35% by mole.

The polymerization ratio "n" of Monomer (Ib) in which Ry is equal to $R_2$ is preferably from 10% by mole to 60% by mole, and more preferably from 20% by mole to 40% by mole.

The polymerization ratio "p" of Monomer (Ic) in which Ry is equal to $R_3$ is preferably from 0% by mole to 20% by mole, and more preferably from 0% by mole to 10% by mole.

$R_1$ is an alkyl group, a cycloalkyl group, or an aryl group other than a phenol or naphthol. $R_1$ is preferably a substituted or unsubstituted, linear or branched alkyl group having 1 to 12 carbon atoms (such as methyl, ethyl, n-propyl, iso-propyl, t-butyl, n-butyl, n-pentyl, n-hexyl, n-heptyl, n-octyl, n-nonyl, n-decyl, n-undecyl, n-dodecyl, methoxymethyl, chloromethyl, trichloromethyl, benzyl, cinnamoyl, iso-propyl, iso-butyl, s-butyl, t-butyl, iso-pentyl, neo-pentyl, 1-methylbutyl, and iso-hexyl groups), substituted or unsubstituted cycloalkyl ring having 3 to 6 carbon atoms in the ring (such as cyclopropyl, cyclobutyl, cyclopentyl, methylcyclohexyl, and cyclohexyl groups), or a substituted or unsubstituted aryl group having 6 or 10 carbon atoms in the aromatic ring other than a phenol or naphthol (such as substituted or unsubstituted phenyl and naphthyl groups, including phenyl, xylyl, toluoyl, p-methoxyphenyl, 3-chlorophenyl, and naphthyl). Typically, $R_1$ is a substituted or unsubstituted alkyl group having 1 to 6 carbon atoms such as n-propyl.

$R_2$ is the same as defined above for Rx in formula (a).

$R_3$ is preferably a substituted or unsubstituted alkynyl group having 2 to 4 carbon atoms (such as ethynyl group), or a substituted or unsubstituted phenyl group (such as phenyl, 4-carboxyphenyl, carboxyalkyleneoxyphenyl, and carboxyalkylphenyl groups). Typically, $R_3$ is a carboxyalkylphenyl group, 4-carboxyphenyl, or carboxyalkyleneoxyphenyl group, or another carboxy-containing phenyl group.

The poly (vinylacetals) in the present embodiment may be at least a tetramer in accordance with the number of different recurring units that are present in the polymer. For example, there may be many different types of recurring units in the polymer, which are different from any one of the recurring units in the categories defined above with respect to the structures (Ia) to (Ic). For example, the poly (vinylacetal) of formula (a) may have recurring units of the structure (Ia) that have different $R_1$ groups from each other. Such a diversity of the recurring unit is also applied to the recurring unit represented by any one of the structures (Ia) to (Ic).

The polymer in the present embodiment may contain recurring units other than those defined above. Such recurring units will be recognized with ease by one skilled in the art. That is, in the broadest sense, the recurring unit is not limited to those defined above. However, in accordance with the embodiment, only the above-described recurring unit may be present in formula (a).

Examples of copolymerization unit suitable for coexistence include [Id: —(CHR—$CR^1R^4$)—]. $R^4$ is preferably an —O—C(=O)—$R^5$ group wherein $R^5$ represents a substituted or unsubstituted alkyl group having 1 to 12 carbon atoms, or a substituted or unsubstituted aryl group having 6 or 10 carbon atoms in an aromatic ring thereof, similar to the above-described definition of $R^1$. Typically, $R^5$ represents a substituted or unsubstituted alkyl group having 1 to 6 carbon atoms, for example, an unsubstituted methyl group. Alternatively, [Ie: —(CHR—CR'OH)—] may be exemplified. The copolymerization ratio of the recurring unit (Id) is preferably from 1% by mole to 20% by mole, and more preferably from 1% by mole to 15% by mole. The copolymerization ratio of the recurring unit (Ie) is preferably from 5% by mole to 60% by mole, and more preferably from 15% by mole to 55% by mole.

$R^5$ is preferably a hydroxy group.

The content of the acetal resin in the recording layer is not particularly limited, but preferably from 10% by mass to 99% by mass, and more preferably from 30% by mass to 95% by mass, with respect to the total solid content of the recording layer. Many embodiments would include a primary polymeric binder in an amount of from 50 to 90% by mass of the total composition or layer dry mass. Herein, the primary polymeric binder refers to one or more alkali-soluble (developing-solution-soluble) resin(s) contained in the lithographic printing plate precursor according to the present invention. Typical examples thereof include various kinds of poly(vinyl acetals) and the following phenolic resins.

The poly(vinyl acetals) described herein can be prepared using known starting materials and reaction conditions including those described in U.S. Pat. No. 6,541,181 (noted above). For example, acetalization of the polyvinyl alcohols is caused to obtain a reaction product in accordance with known standard methods for example as described in U.S. Pat. No. 4,665,124 (Dhillon et al.), U.S. Pat. No. 4,940,646 (Pawlowski), U.S. Pat. No. 5,169,898 (Walls et al.), U.S. Pat. No. 5,700,619 (Dwars et al.), U.S. Pat. No. 5,792,823 (Kim et al.), and in JP-A-9-328519 (Yoshinaga).

The weight-average molecular weight (Mw) of the above-described acetal resin is not particularly limited, but preferably from 5,000 to 300,000, and more preferably from 20,000 to 50,000.

The poly (vinyl acetal) resins are described, for example, in U.S. Pat. No. 6,255,033, U.S. Pat. No. 6,541,181, and WO 2004/081662. The same or similar poly(vinyl acetals) are described by Structures (I) and (II) containing structural units (a) through (e) in EP 1 627 732 (Hatanaka et al.), US 2005/0214677 (Nagashima) and US 2005/0214678 (Nagashima), all cited herein with respect to the poly(vinyl acetals) described therein.

(Phenolic Resin)

Various phenolic resins can also be used in the recording layer in the embodiments. Examples of the phenolic resins include hosphor resins such as condensation polymers of phenol and formaldehyde, condensation polymers of m-cresol and formaldehyde, condensation polymers of p-cresol and formaldehyde, condensation polymers of m-/p- mixed cresol and formaldehyde, condensation polymers of phenol, cresol (m-, p-, or m-p-mixture) and formaldehyde, and condensation copolymers of pyrogallol and acetone. Further, copolymers obtained by copolymerizing compound containing phenol groups in the side chains can be used. Mixtures of such polymeric binders can also be used.

Novolac resins having a weight average molecular weight of at least 1500 and a number average molecular weight of at least 300 are useful. Generally, the weight average molecular weight is in the range of from 3,000 to 300,000, the number average molecular weight is from 500 to 250,000, and the degree of dispersion (weight average molecular weight/number average molecular weight) is in the range of from 1.1 to 10.

Certain mixtures of the primary polymeric binders described above can be used, including mixtures of one or more poly(vinyl acetals) and one or more phenolic resins. For example, mixtures of one or more poly(vinyl acetals) and one or more hosphor or resol resins (or both hosphor and resol resins) can be used.

The lithographic printing plate precursor according to the present invention may contain a secondary polymeric binder.

Herein, the secondary polymeric binder refers to a resin which can be used in combination with the above primary polymer binder. The secondary polymeric binder is generally an alkali-soluble resin from the view point of not diminishing the positive-type photosensitivity of the lithographic printing plate precursor.

<Acidic Group-Containing Polymer>

Examples of secondary polymeric binders include the following classes of polymers having an acidic group in (1) through (5) shown below on a main chain and/or side chain (pendant group).

(1) Sulfone amide group ($-SO_2NH-R$)
(2) Substituted sulfonamido based acid group (hereinafter, referred to as active imido group) [such as $-SO_2NHCOR$, $-SO_2NHSO_2R$, $-CONHSO_2R$]
(3) Carboxylic acid group ($-CO_2H$)
(4) Sulfonic acid group ($-SO_3H$)
(5) Phosphoric acid group ($-OPO_3H_2$)

R in the above-mentioned groups (1) to (5) represents a hydrogen atom or a hydrocarbon group.

Representative secondary polymeric binders having a sulfone amide group of the substituent (1) are, for instance, polymers that are constituted of a minimum constituent unit as a main component derived from a compound having a sulfone amide group. Thus, examples of such a compound include a compound having, in a molecule thereof, at least one sulfone amide group in which at least one hydrogen atom is bound to a nitrogen atom and at least one polymerizable unsaturated group. Among these compounds are m-aminosulfonylphenyl methacrylate, N-(p-aminosulfonylphenyl) methacrylamide, and N-(p-aminosulfonylphenyl)acrylamide. Thus, a homopolymer or a copolymer of polymerizing monomers having a sulfoneamide group such as m-aminosulfonylphenyl methacrylate, N-(p-aminosulfonylphenyl) methacryl amide, or N-(p-aminosulfonylphenyl)acrylamide can be used.

Examples of the secondary polymeric binders with an activated imido group of the substituent (2) are polymers containing recurring units derived from compounds having activated imido group as the main constituent component. Examples of such compounds include polymerizable unsaturated compounds having a moiety defined by a structural formula $-(CO)(NH)(SO_2)-$.

N-(p-toluenesulfonyl)methacrylamide and N-(p-toluenesulfonyl)acrylamide are examples of such polymerizable compounds.

Secondary polymeric binders having any of the substituents (3) through (5) include those readily prepared by reacting ethylenically unsaturated polymerizable monomers having the desired acidic groups, or groups that can be converted to such acidic groups after polymerization.

Regarding the minimum constituent units having an acidic group that is selected from the substituents (1) through (5), there is no need to use only one kind of acidic group in the polymer, and in some embodiments, it may be useful to have at least two kinds of acidic groups. Obviously, not every recurring unit in the secondary polymeric binder must have one of the acidic groups, but usually at least 10 mole % and typically at least 20 mole % contain the recurring units having one of the above-mentioned acidic groups.

The acid group-containing polymer can have a weight average molecular weight of at least 2,000 and a number average molecular weight of at least 500. Typically, the weight average molecular weight is from 5,000 to 300,000, the number average molecular weight is from 800 to 250,000, and the degree of dispersion (weight average molecular weight/number average molecular weight) is from 1.1 to 10.

The acid group-containing polymer may be used with the one or more primary polymeric binders. The content of the acid group-containing polymer is not particularly limited, but preferably at least 1% by mass and not more than 50% by mass, and more preferably from 5% by mass to 30% by mass.

Regarding the description of the group (atomic groups) in the present specification, the description in which neither "substitution" nor "non-substitution" is labeled includes those having no substituent as well as those having a substituent. For example, the term "alkyl group" includes not only an alkyl group having no substituent (an unsubstituted alkyl group), but also an alkyl group having a substituent (a substituted alkyl group). In the present specification, the *** compound or resin, or polymer means to embrace the compound itself, and in addition thereto, a salt thereof and an ion or the like thereof. Typically, this compound means the compound and/or a salt thereof. The same goes for the surfactant described below. Accordingly, the compound described therein may be present as an ion thereof without a counter ion, or alternatively may be a salt thereof.

Herein, the molecular weight and the degree of dispersion are values obtained by measurement in accordance with GPC (gel permeation chromatography) method, unless otherwise specified. The molecular weight is defined as a weight-average molecular weight in polystyrene equivalent. The gel packed in the column used for GPC method is preferably a gel having an aromatic compound in the repeating unit, and examples thereof include a gel comprising a styrene-divinylbenzene copolymer. Two to six columns are preferably connected and used. The solvent used includes an ether-based solvent such as tetrahydrofuran, and an amide-based solvent such as N-methylpyrrolidinone. The measurement is preferably performed at a solvent flow rate of 0.1 to 2 mL/min, most preferably from 0.5 to 1.5 mL/min. When the measurement is performed in this range, the measurement can be performed more efficiently without imposing a load on the apparatus. The measurement temperature is preferably from 10° C. to 50° C., and most preferably from 20° C. to 40° C. The column and the carrier used in this measurement may be selected appropriately in accordance with physical properties of the polymer to be measured.

<Surfactant>
(Amphoteric Surfactant)

Preferred examples of the amphoteric surfactant include the amphoteric surfactant represented by any one of formulae (I) to (III).

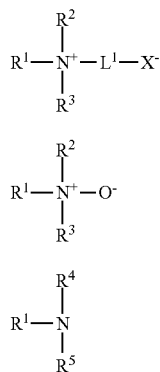

$R^1$ represents an alkyl group having 6 to 24 carbon atoms, or an alkyl group through a particular connecting group. Especially preferred is a straight chain alkyl group having 8 to 18 carbon atoms or an alkyl group having 8 to 18 carbon atoms through a particular connecting group. The particular connecting group is preferably an amide group.

$R^2$ and $R^3$ each independently represent an alkyl group having 1 to 5 carbon atoms. Among these, a methyl group, an ethyl group and a 2-hydroxyethyl group are preferable.

$R^4$ and $R^5$ each independently represents an alkyl group having 1 to 5 carbon atoms and having an acid group or a salt thereof (preferably a carboxyl group or a salt thereof) at the end of the alkyl group. Especially preferred are a 2-carboxymethyl group, a 2-carboxyethyl group, a 2-carboxypropyl group, a carboxypolyethyleneoxide group, and a carboxypolypropyleneoxide group.

$L^1$ represents a linking group having 1 to 4 carbon atoms. Among these, an alkylene group is preferable; and a methylene group, an ethylene group and a propylene group are more preferable.

$X^-$ represents a carboxylate ion (or a salt thereof), a sulfonate ion (or a salt thereof), a sulfate ion (or a salt thereof), a phosphonate ion (or a salt thereof), or a phosphate ion (or a salt thereof).

The above-described anionic group may form a salt thereof. Examples of the counter ion include a sodium ion, a potassium ion, a magnesium ion, and a calcium ion.

Examples of the amphoteric surfactant include alkyldi(aminoethyl)glycine, alkylpolyaminoethyl glycine hydrochloride, 2-alkyl-N-carboxyethyl-N-hydroxyethyl imidazolinium betaine, and N-tetradecyl-N,N-betaine.

Specific examples of the amphoteric surfactant represented by the above-described formula (I) include REBON 2000, REBON LD36 (trade names, manufactured by Sanyo Chemical Industries, Ltd.), TEXNOL R2 (trade name, manufactured by Nippon Nyukazai Co., Ltd.,) AM-301, AM-3130N (trade names, manufactured by Nikko Chemicals Co., Ltd.), AMPHITOL 20AB, AMPHITOL 20BS, AMPHITOL 24B, AMPHITOL 55AB, AMPHITOL 86B (trade names, manufactured by Kao Corporation), ADEKA AMPHOTE AB-35L, ADEKA AMPHOTE PB-30L (trade names, manufactured by ADEKA Corporation), AMPHOREX CB-1, AMPHOREX LB-2 (trade names, manufactured by Miyoshi Oil & Fat Co., Ltd.), ENAGICOL C-30B, ENAGICOL L-30B (trade names, manufactured by Lion Corporation), OBAZOLIN BC, OBAZOLIN CAB-30, OBAZOLIN LB-SF, OBAZOLIN LB (trade names, manufactured by Toho Chemical Industry Co., Ltd.), SOFTAZOLINE CPB-R, SOFTAZOLINE CPB, SOFTAZOLINE LPB-R, SOFTAZOLINE LPB, SOFTAZOLINE MPB, SOFTAZOLINE PKBP (trade names, manufactured by Kawaken Fine Chemicals Co., Ltd.), and NISSAN ANON BDC-S, NISSAN ANON BDF-R, NISSAN ANON BDF-SF, NISSAN ANON BF, NISSAN ANON BL-SF, and NISSAN ANON BL (trade names, manufactured by NOF Corporation).

Specific examples of the amphoteric surfactant represented by the above-described formula (II) include AMPHITOL 20N (trade name, manufactured by Kao Corporation), SOFTAZOLINE LAO-C, SOFTAZOLINE LAO (trade names, manufactured by Kawaken Fine Chemicals Co., Ltd.), UNISAFE A-OM (trade name, manufactured by NOF Corporation), CATINAL AOC (trade name, manufactured by Toho Chemical Industry Co., Ltd.), and AROMOX DMC-W (trade name, manufactured by Lion Corp.).

Specific examples of the amphoteric surfactant represented by formula (III) include ENAGICOL DP-30 (trade name, manufactured by Lion Corp.), DELIPHAT 160C (trade name, manufactured by Cognis Japan Ltd.) and Pionin C158G (trade name, manufactured by TAKEMOTO OIL & FAT CO., LTD).

Further, specific examples of the above-described amphoteric surfactant are exemplified below by means of chemical structural formula.

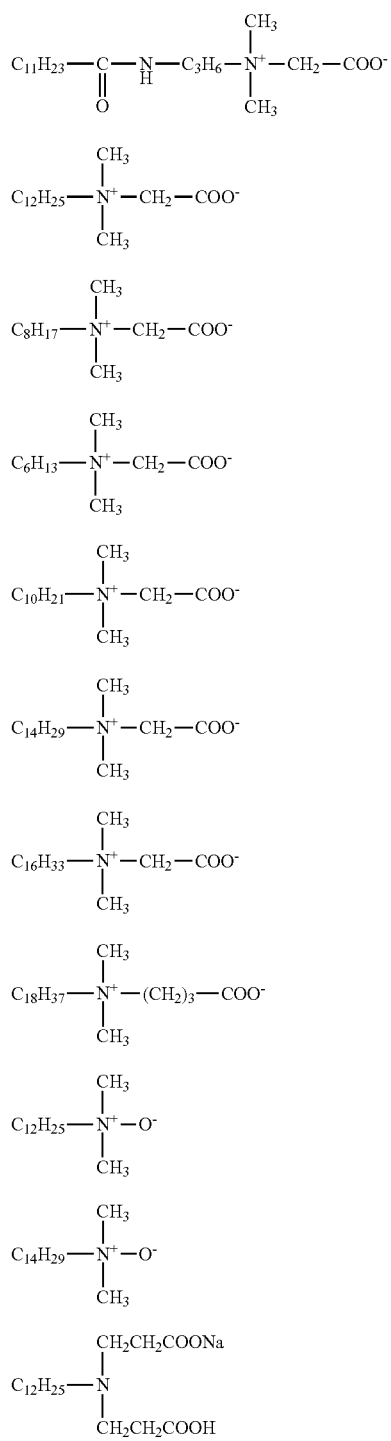

The compounds represented by formulae (I) to (II) may be used alone, or in combination of two or more thereof.

Although there are partially-overlapped substances, other examples of the amphoteric surfactant include: amine oxide-based surfactants such as alkyl dimethylamine oxide; betaine-based surfactants such as alkyl betaine, fatty acid amide propyl betaine, or alkyl imidazole; and amino acid-based surfactants such as a sodium salt of alkylamino fatty acid.

In particular, an alkyldimethylamine oxide which may have a substituent, an alkyl carboxy betaine which may have a substituent and an alkyl sulfo betaine which may have a substituent are preferably used. Specific examples thereof include compounds represented by formula (2) in Paragraph No. [0256] of JP-A-2008-203359, compounds represented by formulae (I), (II) and (VI) in Paragraph No. [0028] of JP-A-2008-276166 and compounds described in Paragraph Nos. [0022] to [0029] of JP-A-2009-47927.

As the amphoteric surfactant used in a developing solution, the compound represented by the following formula (S1), the compound represented by the following formula (S2), and the compound represented by the following formula (S3) are preferable.

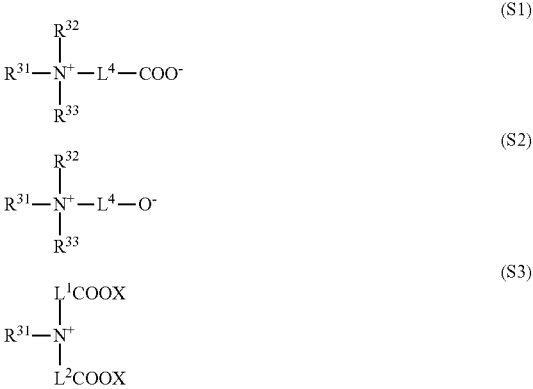

In formulae (S1), (S2) and (S3), $R^{31}$ each independently represent an alkyl group having 8 to 20 carbon atoms, or an alkyl group having a connecting group in which the total number of carbon atoms is from 8 to 20. $R^{32}$ and $R^{33}$ each independently represent a hydrogen atom, an alkyl group, or an ethyleneoxide group. $L^4$ each independently represent a single bond, or an alkylene group. Further, two groups of $R^{31}$, $R^{32}$, $R^{33}$ and $L^4$ may bind to one another to form a ring structure. $L^1$ and $L^2$ represent a connecting group having 1 to 4 carbon atoms. Especially, an alkylene group is preferable. A methylene group, an ethylene group, and a propylene group are preferable. X represents a hydrogen atom, or an alkali metal (preferably sodium, or potassium).

In the compound represented by the above-described formula (S1), or the compound represented by formula (S2) or (S3), as the total carbon number increases, a hydrophobic portion becomes larger, which results in reduction of solubility with respect to an aqueous developing solution. In this case, the solubility is improved by mixing water with an organic solvent such as alcohols capable of assisting solubility as a dissolution aid. However, in the case where the total carbon number becomes too large, the surfactant cannot be dissolved within an adequate mixing range. Accordingly, the total number of carbon atoms for $R^{31}$, $R^{32}$ and $R^{33}$ are preferably from 10 to 40, and more preferably from 12 to 30.

The connecting group-containing alkyl group represented by $R^{31}$ has the structure in which the connecting group is laid between alkyl groups. That is, in the case where the connecting group is single, the structure can be represented by "-alkylene group-connecting group-alkyl group". Examples of the connecting group include an ester bond, a carbonyl bond, and an amide bond. Although the number of the connecting group may be two or more, one connecting group is preferable. Especially, an amide bond is preferable. The total carbon number of the alkylene group that binds to the connecting group is preferably from 1 to 5. The alkylene group may be a straight chain, or branched. A straight chain alkylene group is preferable. The carbon number of the alkyl group that binds to the connecting group is preferably from 3 to 19. The alkyl group may be a straight chain, or branched. A straight chain alkyl group is preferable.

In the case where $R^{32}$ is an alkyl group, the carbon number thereof is preferably from 1 to 5, and especially preferably from 1 to 3. The alkyl group may be a straight chain, or branched. A straight chain alkyl group is preferable.

In the case where $R^{33}$ is an alkyl group, the carbon number thereof is preferably from 1 to 5, and especially preferably from 1 to 3. The alkyl group may be a straight chain, or branched. A straight chain alkyl group is preferable.

Examples of the ethyleneoxide-containing group represented by $R^{33}$ include a group represented by —Ra(CH$_2$CH$_2$O)$_n$Rb. Herein, Ra represents a single bond, an oxygen atom, or a divalent organic group (preferably carbon atoms of 10 or less). Rb represents a hydrogen atom, or an organic group (preferably carbon atoms of 10 or less). n represents an integer of 1 to 10.

In the case where $L^4$ is an alkylene group, the carbon number thereof is preferably from 1 to 5, and especially preferably from 1 to 3. The alkylene group may be a straight chain, or branched. A straight chain alkylene group is preferable.

Each of the compounds represented by formula (S1), formula (S2), or formula (S3) preferably has an amide bond. Each of the compounds preferably has an amide bond as a connecting group of $R^{31}$.

Representative examples of the compounds represented by formula (S1), formula (S2), or formula (S3) are shown below. However, the present invention is not limited to these compounds.

(I-a)

$C_{12}H_{25}-\overset{\underset{|}{CH_3}}{\underset{\underset{|}{CH_3}}{N^+}}-CH_2-COO^-$ (I-b)

$C_{16}H_{33}-\overset{\underset{|}{CH_3}}{\underset{\underset{|}{CH_3}}{N^+}}-CH_2-COO^-$ (I-c)

$C_{18}H_{37}-\overset{\underset{|}{CH_3}}{\underset{\underset{|}{CH_3}}{N^+}}-CH_2-COO^-$ (I-d)

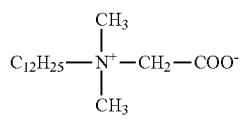

(I-e)

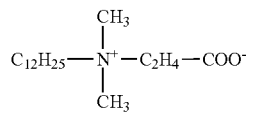

(I-f)

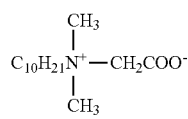

(I-g)

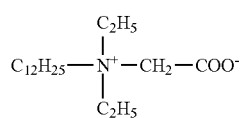

(I-h)

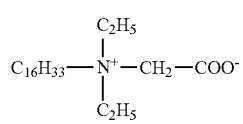

(I-i)

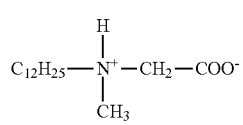

(I-j)

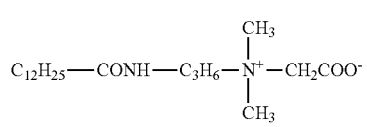

(I-k)

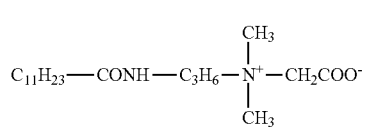

(I-l)

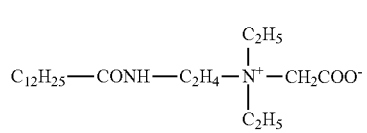

(I-m)

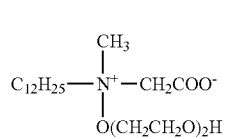

(I-n)

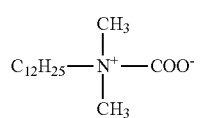

(I-o)

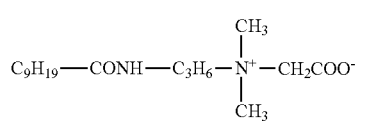

(I-p)

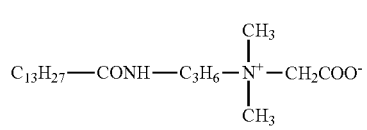

(I-q)

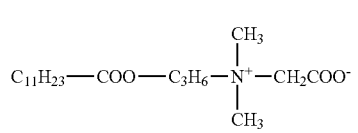

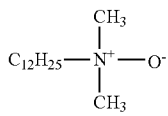 (II-a)

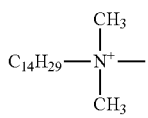 (II-b)

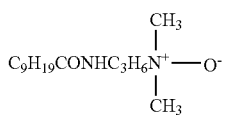 (II-c)

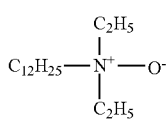 (II-d)

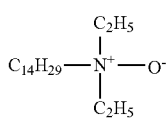 (II-e)

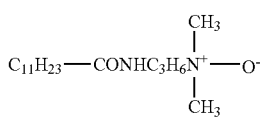 (II-f)

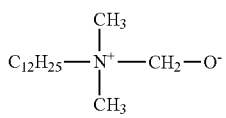 (II-g)

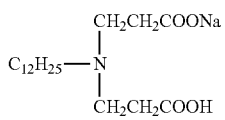 (II-h)

The compounds represented by formula (S1), formula (S2), or formula (S3) can be synthesized in accordance with known methods. Further, commercially available products may be used. As for the commercially available product, examples of the compound represented by formula (S1) include SOFTAZOLINE LPB, SOFTAZOLINE LPB-R, BISTA MAP produced by Kawaken Fine Chemicals Co., Ltd., and TAKESURF C-157L produced by TAKEMOTO OIL & FAT Co., Ltd. Examples of the compound represented by formula (S2) include SOFTAZOLINE LAO produced by Kawaken Fine Chemicals Co., Ltd., and AMOGEN AOL produced by Dai-ichi Kogyo Seiyaku Co., Ltd.

The amphoteric surfactant may be used singly or in combination of two or more kinds in the developing solution.

(Anionic Surfactant)

Preferred examples of the anionic surfactant include the anionic surfactant represented by any one of formulae (IV) to (VII).

$$R^6-L^{12}-D^1 \quad (IV)$$

$$R^7-L^{13}-E^1 \quad (V)$$

$$R^8-L^{14}-F^1 \quad (VI)$$

$$R^9-L^{15}-G^1-L^{16} \quad (VII)$$

In formulae (IV) to (VII), $R^6$ and $R^9$ each independently represent an alkyl group having 6 to 24 carbon atoms. $L^{12}$ represents a phenylene group or a single bond. $D^1$, $E^1$ and $F^1$ each independently represent a sulfonate ion or a salt thereof, or a sulfate ion or a salt thereof. $R^7$ represents an alkyl group having 4 to 18 carbon atoms. $L^{13}$ represents a phenylene group or a naphthylene group. $R^8$ represents a phenyl group or a naphthyl group. $L^{14}$ represents a polyalkyleneoxy group. $L^{15}$ represents a phenylene group. $G^1$ represents an oxygen atom. $L^{16}$ represents a phenyl group.

Examples of the anionic surfactant include fatty acid salts, abietic acid salts, hydroxyalkane sulfonates, alkane sulfonates, dialkyl sulfosuccinates, linear alkylbenzene sulfonates, branched alkylbenzene sulfonates, alkyl naphthalene sulfonates, alkyl phenoxy polyoxyethylene propyl sulfonates, polyoxyethylene alkyl sulfophenyl ether salts, N-methyl-N-oleyl taurine sodiums, N-alkylsulfosuccinic acid monoamide disodium salts, petroleum sulfonates, sulfated castor oil, sulfated beef tallow oil, sulfates of fatty acid alkyl esters, alkyl sulfate salts, polyoxyethylene alkyl ether sulfate salts, fatty acid monoglyceride sulfate salts, polyoxyethylene alkylphenyl ether sulfate salts, polyoxyethylene styryl phenyl ether sulfate salts, alkyl phosphate salts, polyoxyethylene alkyl ether phosphate salts, polyoxyethylene alkyl phenyl ether phosphate salts, partially saponified styrene-maleic acid anhydride copolymers, partially saponified olefin-maleic acid anhydride copolymers, naphthalene sulfonate formalin condensates, aromatic sulfonates, and aromatic substituted polyoxyethylene sulfonates. Among them, a dialkylsulfosuccinate salt, an alkylsulfate ester salt, or an alkylnaphthalenesulfonate salt is preferably used.

As for the anionic surfactant used in the developing solution in the present invention, anionic surfactants containing a sulfonic acid or a sulfonate are especially preferable. The anionic surfactant may be used singly or in combination.

The content of the above-described amphoteric surfactant or anionic surfactant is not particularly limited in the present invention, but generally from more than 1% by mass to less than 20% by mass, preferably from 3% by mass to 15% by mass, and more preferably from 5% by mass to 10% by mass, with respect to the total solid content of the layer containing the surfactant (an upper layer as an example). Setting of the content to the above-described lower limit or more makes it possible to effectively suppress generation of a running residue in particular, which is favorable. Meanwhile, setting of the content to the above-described upper limit or less makes it possible to suppress film wearing and to get sufficient plate durability, which is favorable. In a relationship with the above-described particular resin, from the same viewpoint as described above, the content of the amphoteric surfactant or anionic surfactant is preferably from 0.5 part by mass to 40 parts by mass, more preferably from 1 part by mass to 18 parts by mass, and still more preferably from 1 part by mass to 16 parts by mass, with respect to 100 parts by mass of the particular resin. Setting of the content to the above-described lower limit or more makes it possible to effectively suppress generation of a running residue in particular, which is favorable.

(Other Surfactant)

The developing solution may contain nonionic surfactants, cationic surfactants or the like other than the above-described surfactants, as far as the effect of the present invention is not undermined.

Examples of the nonionic surfactant include a polyethylene glycol type higher alcohol ethylene oxide adduct, an alkylphenol ethylene oxide adduct, a polyethylene glycol adduct of an aromatic compound, a fatty acid ethylene oxide adduct, a polyhydric alcohol fatty acid ester ethylene oxide adduct, a higher alkylamine ethylene oxide adduct, a fatty acid amide ethylene oxide adduct, an ethylene oxide adduct of an oil or fat, a polypropylene glycol ethylene oxide adduct, a dimethylsiloxane-ethylene oxide block copolymer, a dimethylsiloxane-(propylene oxide-ethylene oxide) block copolymer, a polyhydric alcohol type glycerol fatty acid ester, a pentaerythritol fatty acid ester, sorbitol and sorbitan fatty acid esters, a sucrose fatty acid ester, a polyhydric alcohol alkyl ether, and an alkanolamine fatty acid amide.

The above-described nonionic surfactant preferably includes a nonionic aromatic ether-type surfactant, and more preferably adducts of ethyleneoxide and/or propyleneoxide of phenol or naphthol, which may have a nondissociative substituent. This surfactant may be used singly or in combination of two or more kinds.

Examples of the cationic surfactant include alkylamine salts, quaternary ammonium salts, polyoxyethylene alkylamine salts, and polyethylene polyamine derivatives.

The content of the amphoteric surfactant and/or the anionic surfactant is preferably largest even in the case where a nonionic surfactant or a cationic surfactant is used together with the amphoteric surfactant and/or the anionic surfactant. The amphoteric surfactant and/or the anionic surfactant is preferably 50% by mass or more, and more preferably 60% by mass or more, with respect to the total amount of the surfactant.

Regarding the above amphoteric surfactant, for example, JP-A-4-13149 and JP-A-59-121044 can be referred.

The content of the surfactant other than the amphoteric surfactant and the anionic surfactant is preferably from 0.01% by mass to 10% by mass, and more preferably from 0.01% by mass to 5% by mass, with respect to the total solid content of the recording layer.

<Infrared Absorbing Agent>

The recording layer of the lithographic printing plate precursor according to the present invention contains an infrared absorbing agent. The infrared absorbing agent is not particularly limited as long as it is a dye that absorbs infrared light and generates heat, and various dyes known as infrared absorbing agents may be used.

As the infrared absorbing agent that can be used in the present invention, commercially available dyes and known dyes described in literatures, for example, Senryo Binran (Dye Handbook) compiled by The Society of Synthetic Organic Chemistry, Japan (1970) can be used. Specifically, examples of the dyes include azo dyes, metal complex azo dyes, pyrazolone azo dyes, anthraquinone dyes, phthalocyanine dyes, carbonium dyes, quinoneimine dyes, methine dyes, and cyanine dyes. In the present invention, among these dyes, those capable of absorbing at least an infrared light or a near-infrared light are preferred as suitable for use with a laser that emits an infrared light or a near-infrared light. Especially, cyanine dyes are preferable.

Among these dyes, particularly preferred examples include cyanine dyes, phthalocyanine dyes, oxonol dyes, squarylium dyes, pyrylium salts, thiopyrylium dyes, and nickel thiolate complexes. Further, the cyanine dye represented by the following formula (x) is most preferably used in the upper layer of the recording layer according to the present invention because the cyanine dye imparts polymerization activity and exhibits excellent stability and economic efficiency.

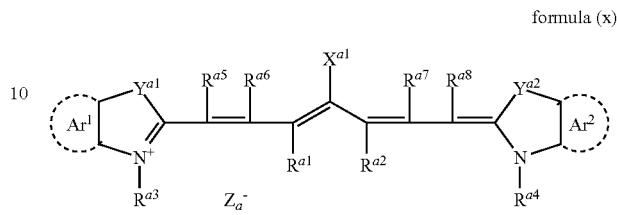

formula (x)

In formula (x), $X^{a1}$ represents a hydrogen atom, a halogen atom, —$NPh_2$, —$X^{a2}$-$L^{a1}$ or a group shown below. $X^{a2}$ represents an oxygen atom or a sulfur atom. $L^{a1}$ represents a hydrocarbon group having from 1 to 12 carbon atoms, an aryl group containing a hetero atom, or a hydrocarbon group having from 1 to 12 carbon atoms and containing a hetero atom. Herein, the hetero atom refers to N, S, O, a halogen atom and Se. Ph means a phenyl group.

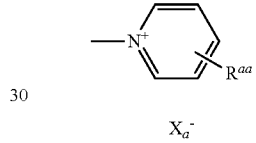

In the above formula, $X_a^-$ has the same meaning as $Z_a^-$ defined hereinafter. $R^{aa}$ represents a hydrogen atom or a substituent selected from an alkyl group, an aryl group, a substituted or unsubstituted amino group and a halogen atom.

$R^{a1}$ and $R^{a2}$ each independently represents a hydrocarbon group having from 1 to 12 carbon atoms. In view of the preservation stability of a coating solution for photosensitive layer, it is preferred that $R^{a1}$ and $R^{a2}$ each represent a hydrocarbon group having two or more carbon atoms. Further, $R^{a1}$ and $R^{a2}$ may be combined with each other to form a ring. In the case of forming a ring, it is particularly preferred to form a 5-membered or 6-membered ring.

$Ar^1$ and $Ar^2$, which may be the same or different, each independently represent an aromatic hydrocarbon group which may have a substituent. Preferable examples of the aromatic hydrocarbon group include a benzene ring group and a naphthalene ring group. Preferable examples of the substituent include a hydrocarbon group having 12 or less carbon atoms, a halogen atom and an alkoxy group having 12 or less carbon atoms.

$Y^{a1}$ and $Y^{a2}$, which may be the same or different, each independently represent a sulfur atom or a dialkylmethylene group having 12 or less carbon atoms. $R^{a3}$ and $R^{a4}$, which may be the same or different, each independently represent a hydrocarbon group having 20 or less carbon atoms, which may have a substituent. Preferable examples of the substituent include an alkoxy group having 12 or less carbon atoms, a carboxyl group and a sulfo group.

$R^{a5}$, $R^{a6}$, $R^{a7}$ and $R^{a8}$, which may be the same or different, each independently represent a hydrogen atom or a hydrocarbon group having 12 or less carbon atoms. From the standpoint of the availability of raw materials, a hydrogen atom is preferred. $Za^-$ represents a counter anion. However, $Za^-$ is not necessary when the cyanine dye represented by formula (x)

has an anionic substituent in the structure thereof and the neutralization of charge is not needed. Preferable examples of the counter ion for Za⁻ include a halide ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion in view of the preservation stability of a coating solution for photosensitive layer.

Specific examples of the cyanine dye represented by formula (x) which can be preferably used in the invention include compounds described in Paragraph Nos. [0017] to [0019] of JP-A-2001-133969, Paragraph Nos. [0012] to [0038] of JP-A-2002-40638 and Paragraph Nos. [0012] to [0023] of JP-A-2002-23360.

Particularly preferred infrared absorbing agent is cyanine dye A below.

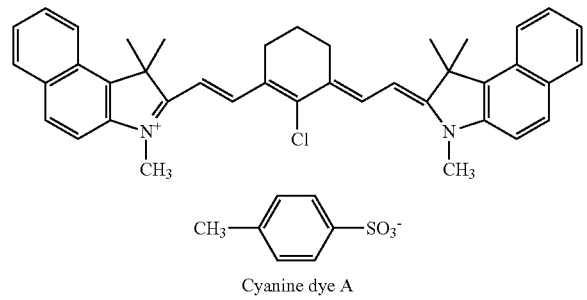

Cyanine dye A

The amount of infrared absorbing agent to be is preferably 0.01 to 50% by mass relative to the total solid content of the recording layer, more preferably 0.1 to 30% by mass, and particularly preferably 1.0 to 30% by mass. If the addition amount is equal to or more than 0.01% by mass, high sensitivity is achieved. Meanwhile, if the addition amount is equal to or less than 50% by mass, a high degree of uniformity of the layer is obtained and the layer has good durability.

<Constitution of Recording Layer>

In the present invention, the constitution of the recording layer is not particularly limited, and an embodiment of the image recording layer having multilayers composed of an upper layer and a lower layer is useful as well as another embodiment of a single layer constitution. When the above-described first to third embodiments are separately described, the above-described multilayer-image-recording layer is preferably used in the first and second embodiments. Meanwhile, a single layer-image-recording layer is preferably used in the third embodiment. The multilayer-image-recording layer of the first and second embodiments is described below as an example. The optional components used in the multilayer-image-recording layer may be also used arbitrarily in the third embodiment, if needed.

Examples of the configuration in terms of the layer constitution and components in the first embodiment (polyurethane resin) include the following combinations. Among these examples, the layer constitutions of Examples 2, 5, 6 and 7 are preferable, and the layer constitutions of Examples 2, 5 and 6 are more preferable.

TABLE A

| Example | Recording layer | Spec. AS resin | Spec. PU | Surfactant | Novolac resin | IR absorber |
|---|---|---|---|---|---|---|
| 1 | Upper layer | ○ | ○ | ○ | ○ | |
| | Lower layer | | | | | ○ |
| 2 | Upper layer | | ○ | ○ | ○ | |
| | Lower layer | ○ | | | | ○ |
| 3 | Upper layer | ○ | ○ | | ○ | |
| | Lower layer | | | ○ | | ○ |
| 4 | Upper layer | ○ | ○ | | ○ | |
| | Lower layer | | | ○ | | ○ |
| 5 | Upper layer | | ○ | ○ | | |
| | Lower layer | ○ | | | | ○ |
| 6 | Upper layer | | ○ | ○ | | |
| | Lower layer | ○ | | | ○ | ○ |
| 7 | Upper layer | | ○ | ○ | ○ | |
| | Lower layer | ○ | | | ○ | ○ |

Spec. AS resin: Specific Alkali Soluble or dispersible resin
Spec. PU: Specific polyurethane
IR absorber: Infrared Ray absorbing agent
"○" means that the material is applied.

<Constitution of Recording Layer>

Examples of the configuration in terms of the layer constitution and components in the second embodiment (maleimide resin) include the following combinations.

TABLE B

| Example | Recording layer | Spec. MI resin A | Surfactant | Novolac resin | IR absorber |
|---|---|---|---|---|---|
| 1 | Upper layer | | | ○ | |
| | Lower layer | ○ | ○ | | ○ |
| 2 | Upper layer | ○ | ○ | ○ | |
| | Lower layer | | | | ○ |
| 3 | Upper layer | ○ | | ○ | |
| | Lower layer | | ○ | | ○ |

Spec. MI resin A: Specific maleimide resin A
IR absorber: Infrared Ray absorbing agent
"○" means that the material is applied.

The lower layer preferably contains the above-described infrared absorbing agent. Further, other components may be contained as needed, as long as the effect of the present second embodiment is not impaired. Examples of the other component include an alkali-soluble resin having a different structure from the above-described resin. Hereinafter, the alkali-soluble resin having a different structure from the above-described resin is referred to as the other alkali-soluble resin.

<Lower Layer>

The lower layer preferably contains the above-described infrared absorbing agent. Further, the other components may be contained as needed, as long as the effect of the present invention is not impaired. Examples of the other component include an alkali-soluble resin having a different structure from the above-described resin. Hereinafter, the alkali-soluble resin having a different structure from the above-described resin is referred to as the other alkali-soluble resin.

(Other Alkali-Soluble Resin)

In the present invention, the term "alkali-soluble" means that the resin is soluble in an alkaline solution with a pH of from 8.5 to 13.5 by a processing of a standard developing time. In the first and second embodiments, the resin is dissolved at a pH of more preferably from 11.0 to 13.5, still more preferably from 12.0 to 13.5, and especially preferably from 12.5 to 13.5. Meanwhile, in the third embodiments, the resin is dissolved at a pH of more preferably from 8.5 to 10.8, and especially preferably from 9.0 to 10.0.

The other alkali-soluble resin used in the lower layer is not limited in particular, as long as the resin has a property to be dissolved in contact with an alkaline developing solution. The resin has preferably an acidic functional group such as a phenolic hydroxyl group, a sulfonic acid group, a phosphoric acid group, a sulfonamide group, or an active imide group, at the main chain and/or side chain of the polymer. Examples of the resin include a resin containing a monomer having such an acid functional group that imparts alkali solubility, in an amount of 10% by mole or more, and more preferably 20% by mole or more as a component thereof. When the copolymerization component of the monomer that imparts alkali solubility is at least 10 mole %, sufficient alkali solubility is obtained and developability is excellent.

Furthermore, as described in U.S. Pat. No. 4,123,279, a condensation polymer between formaldehyde and a phenol having as a substituent an alkyl group having 3 to 8 carbon atoms, such as a t-butylphenol formaldehyde resin or an octylphenol formaldehyde resin can be cited. The weight-average molecular weight thereof (Mw) is preferably at least 500, and more preferably 1,000 to 700,000. The number-average molecular weight thereof (Mn) is preferably at least 500, and more preferably 750 to 650,000. The dispersity (weight-average molecular weight/number-average molecular weight) is preferably 1.1 to 10.

The other alkali-soluble resin preferably has a weight-average molecular weight of at least 2,000 and a number-average molecular weight of at least 500, and more preferably a weight-average molecular weight of 5,000 to 300,000 and a number-average molecular weight of 800 to 250,000. The other alkali-soluble resin preferably has the dispersity (weight-average molecular weight/number-average molecular weight) of 1.1 to 10.

The other alkali-soluble resin which is optionally contained in the lower layer, may be used alone, or in combination of two or more thereof.

The other alkali-soluble resin may be used in an amount such that the content of the other alkali-soluble resin is from 0% by mass to 98% by mass with respect to the total solid content. The other alkali-soluble resin may be contained in a proportion of 80 parts by mass or less with respect to 100 parts by mass of the above-described particular resin.

<Upper Layer>

The mechanisms to improve solubility with respect to an alkali-aqueous solution by heat in the upper layer are not particularly limited. Any one of the upper layers may be used, as long as the upper layer contains a binder resin whereby solubility of a heated region is improved. Examples of heat used for image formation include heat that is generated in the case where the lower layer containing an infrared absorbing agent is exposed. Examples of the upper layers in which solubility of a heated region is improved by heat include: a layer containing an alkali-soluble resin having a hydrogen bonding ability, such as novolac or urethane; a layer containing both a water-insoluble and alkali-soluble resin and a compound having a suppressive action on dissolution; and a layer containing a compound capable of causing ablation. Further in the upper layer, heat generated by adding an infrared absorbing agent to the upper layer can be used for image formation. Examples of the constitution of the upper layer containing an infrared absorbing agent include: a layer containing an infrared absorbing agent, a water-insoluble and alkali-soluble resin and a compound having a suppressive action on dissolution; and a layer containing an infrared absorbing agent, a water-insoluble and alkali-soluble resin and a compound that generates an acid by heat.

(Water-Insoluble and Alkali-Soluble Resin)

The upper layer of the present invention preferably contains a water-insoluble and alkali-soluble resin in the upper layer. By containing the alkali-soluble resin, an interaction between the infrared absorbing agent and polar groups that the alkali-soluble resin has is formed whereby a positive-type photosensitive layer is formed. With the inclusion of the above-described exemplified resins, preferable examples of the alkali-soluble resin include polyamide resins, epoxy resins, polyacetal resins, acrylic resins, methacrylic resins, polystyrene-based resins, and novolac-type phenol resins.

The alkali-soluble resin that can be used in the present invention is not particularly limited as long as it has the property of dissolving upon contact with an alkaline developing solution, and is preferably a homopolymer containing an acidic group in the main chain and/or a side chain of the polymer, a copolymer thereof, or a mixture thereof.

Such an acidic group-containing alkali-soluble resin preferably has a functional group such as a phenolic hydroxy group, a carboxy group, a sulfonic acid group, a phosphoric acid group, a sulfonamide group, or an active imide group. Therefore, such a resin may be suitably formed by copolymerization of a monomer mixture having one or more ethylenically unsaturated monomers containing the above-mentioned functional groups. Preferred examples of the ethylenically unsaturated monomer having the above-mentioned functional group include acrylic acid, methacrylic acid, a compound represented by the formulae below, and a mixture thereof. In the formulae below, $R^4$ represents a hydrogen atom or a methyl group.

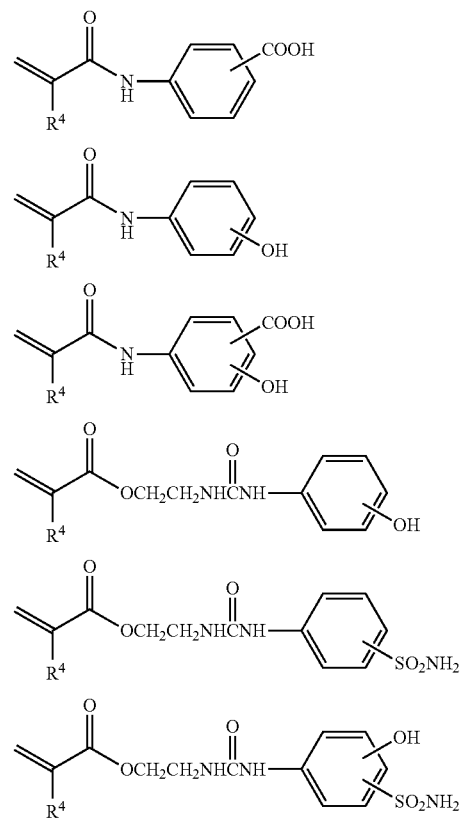

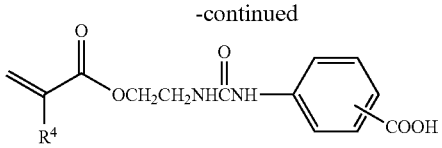

The alkali-soluble resin that can be used in the present invention is preferably a polymeric compound obtained by copolymerizing, in addition to the above-mentioned polymerizable monomer, other polymerizable monomers. With regard to the copolymerization ratio in this case, it is preferable that the copolymer contains at least 10 mole % of a monomer imparting alkali solubility such as a monomer having a functional group, e.g., a phenolic hydroxy group, a carboxy group, a sulfonic acid group, a phosphoric acid group, a sulfonamide group, or an active imide group, and it is more preferable that the copolymer contains at least 20 mole % of the above monomer. When the copolymerization component of the monomer that imparts alkali solubility is at least 10 mole %, sufficient alkali solubility is obtained and developability is excellent.

Examples of the other usable polymerizable monomers include the following compounds: alkyl acrylates and alkyl methacrylates, such as methyl acrylate, ethyl acrylate, propyl acrylate, benzyl acrylate, methyl methacrylate, ethyl methacrylate, cyclohexyl methacrylate, and benzyl methacrylate; acrylates and methacrylates having an aliphatic hydroxyl group, such as 2-hydroxyethyl acrylate and 2-hydroxyethyl methacrylate; acrylamides and methacrylamides, such as acrylamide, methacrylamide, N-methylacrylamide, N-ethyl acrylamide, and N-phenyl acrylamide; vinyl esters such as vinyl acetate, vinyl chloroacetate, vinyl butylate, and vinyl benzoate; styrenes such as styrene, α-methylstyrene, methylstyrene, and chloromethylstyrene; other nitrogen atom-containing monomers such as N-vinylpyrrolidone, N-vinylpyridine, acrylonitrile, and methacrylonitrile; and maleimides such as N-methylmaleimide, N-ethylmaleimide, N-propyl maleimide, N-butyl maleimide, N-phenyl maleimide, N-2-methylphenyl maleimide, N-2,6-diethylphenyl maleimide, N-2-chlorophenyl maleimide, N-cyclohexyl maleimide, N-lauryl maleimide, and N-hydroxyphenyl maleimide.

Among these other ethylenically unsaturated monomers, (meth)acrylates, (meth)acrylamides, maleimides, and (meth)acrylonitrile are preferred.

Furthermore, as the alkali-soluble resin, a novolac resin can be preferably exemplified as stated above.

The water-insoluble and alkali-soluble resin preferably has a weight average molecular weight of 2,000 or more, and a number average molecular weight of 500 or more, and more preferably has a weight average molecular weight of from 5,000 to 300,000, a number average molecular weight of from 800 to 250,000, and a dispersivity (weight average molecular weight/number average molecular weight) of from 1.1 to 10.

The alkali-soluble resin contained in the upper layer of the image recording material according to the present invention may be used alone, or in combination of two or more thereof.

The content of the alkali-soluble resin with respect to the total solid content of the upper layer in the present invention is preferably from 2.0% by mass to 99.5% by mass, more preferably from 10.0% by mass to 99.0% by mass, and still more preferably from 20.0% by mass to 90.0% by mass. If the content is 2.0% by mass or more, good durability of the recording layer (photosensitive layer) is achieved. Meanwhile, if the content is 99.5% by mass or less, the recording layer has high sensitivity as well as good durability.

(Acid-Generating Agent)

The upper layer of the image recording layer preferably contains an acid-generating agent from the viewpoint of improvement in sensitivity.

In the present invention, the acid-generating agent refers to a compound that generates an acid by light or heat, and the compound that decomposes by irradiation of infrared, or heating at 100° C. or higher to generate an acid. The generated acid is preferably a strong acid with pKa of 2 or less, such as sulfonic acid or hydrochloric acid. The acid generated from the acid-generating agent acts as a catalyst whereby the chemical bond of an acid-degradable group is cleaved to become an acid group by which solubility of the upper layer with respect to an alkali aqueous solution is improved.

The acid-generating agent which is preferably used in the invention includes an onium salt, for example, an iodonium salt, a sulfonium salt, a phosphonium salt or a diazonium salt. Specific examples thereof include compounds described, for example, in U.S. Pat. No. 4,708,925 and JP-A-7-20629. In particular, an iodonium salt, a sulfonium salt and a diazonium salt each of which has a sulfonate ion as a counter ion are preferable. As the diazonium salt, diazonium compounds described in U.S. Pat. No. 3,867,147, diazonium compounds described in U.S. Pat. No. 2,632,703, and diazonium resins described in JP-A-1-102456 and JP-A-1-102457 are also preferable. Further, benzylsulfonates described in U.S. Pat. No. 5,135,838 and U.S. Pat. No. 5,200,544 are also preferable. Moreover, active sulfonic acid ester and disulfonyl compounds described in JP-A-2-100054, JP-A-2-100055 and Japanese Patent Application No. 8-9444 (JP-A-9-197671) are also preferable. In addition, haloalkyl-substituted s-triazine compounds described in JP-A-7-271029 are also preferable.

The compounds described as "an acid precursor" in JP-A-8-220752, or the compounds described as "(a) a compound capable of generating an acid by irradiation of activated light rays" in JP-A-9-171254 and the like may be suitably used also as an acid-generating agent in the present invention.

Especially from the viewpoint of sensitivity and stability, an onium salt compound is preferably used as the acid-generating agent. The onium salt compound is described below.

As for the onium salt compound that may be favorably used in the present invention, compounds which are known as a compound that decomposes by infrared exposure and a heat energy that generates from an infrared absorbing agent by the exposure thereby generating an acid may be exemplified. As for the onium salt compound that may be favorably used in the present invention, from the viewpoint of sensitivity, known thermal polymerization initiators and compounds having the following onium salt structure having a bond that is small in terms of bond dissociation energy may be exemplified.

Examples of the onium salt that may be favorably used in the present invention include diazonium salts, iodonium salts, sulfonium salts, ammonium salts, pyridinium salts, and azinium salts, all of which are known. Especially, salts such as sulfonate, carbonate, $BF_4^-$, $PF_6^-$, or $ClO_4^-$ of triaryl sulfonium, or diaryl iodonium are preferable.

Specific examples of the azinium salt compounds include compounds described in paragraph Nos. [0047] to [0056] of JP-A-2008-195018. Further, compounds having an N—O bond, described in JP-A-63-138345, JP-A-63-142345, JP-A-63-142346, JP-A-63-143537 and JP-B-46-42363 ("JP-B" means an examined publication of Japanese patent application) are also favorably used as an acid-generating agent in the present invention.

A preferable addition amount of the acid-generating agent, in the case where the acid-generating agent is added to an upper layer, is in a range of from 0.01% by mass to 50% by mass, more preferably from 0.1% by mass to 40% by mass, and still more preferably from 0.5% by mass to 30% by mass, with respect to the total solid content of the upper layer. In the above-described range, improvement of sensitivity that is an effect due to the addition of the acid-generating agent is achieved and generation of a residual film in the non-image area is suppressed at the same time.

(Acid Proliferator)

An acid proliferator may be added to the upper layer in the present invention.

The acid proliferator in the present invention refers to a compound substituted with a residue of a relatively strong acid and the compound that is easily eliminates in the presence of an acid catalyst to generate a new acid. That is, the acid proliferator decomposes by an acid-catalyzed reaction to generate again an acid (hereinafter referred to as ZOH in formula). One or more acids increase per one reaction whereby an acid concentration increases in an accelerated rate in accordance with a progress of the reaction, which results in tremendously improved sensitivity. The strength of the generated acid is preferably 3 or less, and more preferably 2 or less in terms of acid dissociation constant (pKa). If the pKa of the generated acid is smaller than these values, elimination reaction due to an acid catalyst cannot be caused.

Examples of the acid used for such acid catalyst include dichloroacetic acid, trichloroacetic acid, methane sulfonic acid, ethane sulfonic acid, benzene sulfonic acid, p-toluene sulfonic acid, and naphthalene sulfonic acid.

The acid proliferators described in WO 95/29968, WO 98/24000, JP-A-8-305262, JP-A-9-34106, JP-A-8-248561, JP-T-8-503082, U.S. Pat. No. 5,445,917, JP-T-8-503081, U.S. Pat. No. 5,534,393, U.S. Pat. No. 5,395,736, U.S. Pat. No. 5,741,630, U.S. Pat. No. 5,334,489, U.S. Pat. No. 5,582,956, U.S. Pat. No. 5,578,424, U.S. Pat. No. 5,453,345, U.S. Pat. No. 5,445,917, EP 665,960, EP 757,628, EP 665,961, U.S. Pat. No. 5,667,943, JP-A-10-1598, and the like may be used alone, or in combination of two or more thereof.

The addition amount of the acid proliferator, in the case where the acid proliferator is added to an upper layer, is generally in a range of from 0.01% by mass to 20% by mass, preferably from 0.01% by mass to 10% by mass, and more preferably from 0.1% by mass to 5% by mass, with respect to the total solid content of the upper layer. If the addition amount of the acid proliferator is in the above-described range, a sufficient effect of adding the acid proliferator is obtained whereby improvement in sensitivity is achieved and reduction of film strength in the image area is suppressed at the same time. As a result, good film strength due to the particular resin is kept.

(Other Additives)

When forming the lower layer and the upper layer, in addition to the above essential components, various additives may be added as necessary as long as the effects of the present invention are not impaired. The additives cited below may be added only to the lower layer, only to the upper layer, or to both layers.

(Development Accelerator)

For the purpose of improving the sensitivity, acid anhydrides, phenols, or organic acids may be added to the upper layer and/or the lower layer.

The acid anhydride is preferably a cyclic acid anhydride, and specific examples of the cyclic acid anhydride include phthalic anhydride, tetrahydrophthalic anhydride, hexahydrophthalic anhydride, 3,6-endooxytetrahydrophthalic anhydride, tetrachlorophthalic anhydride, maleic anhydride, chloromaleic anhydride, .α-phenylmaleic anhydride, succinic anhydride, and pyromellitic anhydride described in U.S. Pat. No. 4,115,128. As an acyclic acid anhydride, acetic anhydride, etc. can be cited.

Examples of the phenols include bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane, 4,4',3",4"-tetrahydroxy-3,5,3',5'-tetramethyltriphenylmethane, etc.

As the organic acids, there are those described in JP-A-60-88942, JP-A-2-96755, etc., and specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

The ratio of each of the acid anhydrides, phenols, and organic acids relative to the total solid content of the lower layer or the upper layer is preferably 0.05 to 20% by mass, more preferably 0.1 to 15% by mass, and particularly preferably 0.1 to 10% by mass.

(Other Surfactant)

For the purpose of improving the coating properties, the upper layer and/or the lower layer may contain a copolymer of a fluorine-containing monomer described in JP-A-62-170950, JP-A-11-288093, and JP-A-2003-057820, in addition to the above-described surfactants.

The ratio of the other surfactant relative to the total solid content of the layer containing the other surfactant is preferably 0.01 to 15% by mass, more preferably 0.01 to 5% by mass, and yet more preferably 0.05 to 2.0% by mass.

(Printing-Out Agent/Colorant)

The upper layer and/or the lower layer may contain a dye or a pigment as a printing-out agent or an image colorant to immediately form a visible image after the heating caused by exposure.

Details of the printing-out agent and the colorant are described in paragraph Nos. [0122] to [0123] of JP-A-2009-229917. Accordingly, these compounds described therein may be also suitably used in the present invention.

These dyes are preferably added at a ratio of 0.01 to 10% by mass relative to the total solid content of the lower layer or the upper layer, and more preferably at a ratio of 0.1 to 3% by mass.

(Plasticizer)

A plasticizer may be added to the upper layer and/or the lower layer in order to impart flexibility, etc. to the coating. Examples thereof include butylphthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

These plasticizers are preferably added at a ratio of 0.5 to 10% by mass relative to the total solid content of the lower layer or the upper layer, and more preferably at a ratio of 1.0 to 5% by mass.

(Wax)

For the purpose of imparting resistance to scratching, a compound that reduces the coefficient of static friction of the surface may be added to the upper layer. Specific examples thereof include compounds containing esters of long chain alkylcarboxylic acids, such as those described in U.S. Pat. No. 6,117,913, JP-A-2003-149799, JP-A-2003-302750, or JP-A-2004-12770.

The amount thereof added as a proportion in the upper layer is preferably 0.1 to 10% by mass, and more preferably 0.5 to 5% by mass.

<Formation of Lower Layer and Upper Layer>

The lower layer and the upper layer of the lithographic printing plate precursor of the present invention may usually be formed by dissolving the above-mentioned components in a solvent and coating an appropriate support therewith.

Examples of the solvent used here include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxy ethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, or toluene. However, the present invention is not limited to these solvents. These solvents may be used alone, or in combination of two or more thereof.

The lower layer and the upper layer are in principle preferably formed as two separate layers.

Examples of a method for forming two separate layers include a method in which a difference in solvent solubility between components contained in the lower layer and components contained in the upper layer is utilized.

Examples of another method for forming two separate layers include a method in which, after an upper layer is applied, the solvent is rapidly removed by drying. Separation between these layers is performed more favorably by combining these methods.

These methods are described in detail below, but the method for coating as two separate layers is not limited to these methods.

As the method in which a difference in solvent solubility between the components contained in the lower layer and the components contained in the upper layer is utilized, a solvent system in which all of the components contained in the lower layer are insoluble is used when applying an upper layer coating solution. This enables each layer to be formed in a clearly separated manner even when carrying out two-layer coating. For example, making two layers is possible by selecting as a lower layer component a component that is insoluble in a solvent, such as methyl ethyl ketone or 1-methoxy-2-propanol, that dissolves an alkali-soluble resin, which is an upper layer component, coating and drying the lower layer using a solvent system that dissolves the lower layer component, and subsequently dissolving an upper layer mainly containing an alkali-soluble resin in methyl ethyl ketone, 1-methoxy-2-propanol, etc., followed by coating and drying.

The method for very rapidly drying the solvent after a second layer (upper layer) is applied may be achieved by blowing high-pressure air via a slit nozzle placed at substantially right angles relative to the web traveling direction, applying thermal energy as conductive heat from a lower face of a web using a roll having a heating medium such as steam supplied to the interior thereof (heating roll), or combining the above.

The amount of coating after drying of the lower layer component applied onto the support of the lithographic printing plate precursor is preferably in the range of 0.5 to 4.0 g/m$^2$, and more preferably in the range of 0.6 to 2.5 g/m$^2$. When it is at least 0.5 g/m$^2$, the printing durability is excellent, and when it is no greater than 4.0 g/m$^2$, the image reproduction and sensitivity are excellent.

The amount of coating after drying of the upper layer component is preferably in the range of 0.05 to 1.0 g/m$^2$, and more preferably in the range of 0.08 to 0.7 g/m$^2$. When it is at least 0.05 g/m$^2$, the development latitude and scratch resistance are excellent, and when it is no greater than 1.0 g/m$^2$, the sensitivity is excellent.

The amount of coating after drying of the lower layer and the upper layer in total is preferably in the range of 0.6 to 4.0 g/m$^2$, and more preferably in the range of 0.7 to 2.5 g/m$^2$. When it is at least 0.6 g/m$^2$, the printing durability is excellent, and when it is no greater than 4.0 g/m$^2$, the image reproduction and the sensitivity are excellent.

<Support>

As the support used in the lithographic printing plate precursor of the present invention, a polyester film and an aluminum plate are preferable. Among them, aluminum plates are particularly preferred owing to their good dimensional stability and relatively low cost. Preferred aluminum plates are pure aluminum plates and aluminum alloy plates composed mainly of aluminum and containing a trace amount of different elements. It may be plastic films on which aluminum has been laminated or deposited. Examples of the different elements contained in the aluminum alloys include silicon, iron, manganese, copper, magnesium, chromium, zinc, bismuth, nickel, and titanium. The content of the different elements in total in an alloy is preferably 10% by mass or less.

A particularly desirable aluminum in the present invention is pure aluminum, but since it is difficult to produce completely pure aluminum in terms of refining techniques, it may contain a trace amount of other elements.

Such an aluminum plate applied to the present invention is not specified in terms of composition, and an aluminum plate formed from a conventionally known, widely used material may appropriately be used. The thickness of the aluminum plate used in the present invention is preferably 0.1 to 0.6 mm, more preferably 0.15 to 0.4 mm, and particularly preferably 0.2 to 0.3 mm.

The aluminum plate may be subjected to various kinds of surface treatments such as a roughening treatment or an anodic oxidation treatment, if needed. For the surface treatment of the aluminum plate, treatments may be carried out appropriately, such as a degreasing treatment with a surfactant, an organic solvent, an alkaline aqueous solution, or the like, a roughening treatment on the surface, or an anodic oxidation treatment, as described in detail in paragraph Nos. [0167] to [0169] of JP-A-2009-175195.

After the anodic oxidation treatment, the surface of the aluminum plate is subjected to, as necessary, a hydrophilizing treatment.

Examples of the hydrophilizing treatment to be used include an alkali metal silicate method (for example, sodium silicate aqueous solution) and a method of treating with potassium fluorozirconate or polyvinyl sulfonic acid, as described in paragraph No. of JP-A-2009-175195.

<Undercoat Layer>

In the present invention, an undercoat layer may be disposed, as necessary, between the support and the lower layer.

As the components of the undercoat layer, various organic compounds may be used. Preferable examples of the organic compounds include: carboxymethyl cellulose; dextrin; amino group-containing phosphonic acids; organic phosphonic acids; organic phosphoric acids; an organic phosphinic acid; amino acids; and hydroxyl group-containing amine hydrochlorides. With regard to these undercoat layer components, one type may be used on its own or two or more types may be used as a mixture. Details of the compound used in the undercoat layer and a method of forming the undercoat layer are described in paragraph Nos. [0171] to [0172] of JP-A-2009-175195. These disclosures are also used suitably in the present invention.

The amount of coating of the organic undercoat layer is preferably 2 to 200 mg/m², and more preferably 5 to 100 mg/m². When the amount of coating is in the above-mentioned range, sufficient printing durability can be obtained.

<Backcoat Layer>

The reverse face of the support of the lithographic printing plate precursor of the present invention is provided with a backcoat layer as necessary. As such a backcoat layer, a coating layer comprising an organic polymeric compound described in JP-A-5-45885 or a coating layer comprising a metal oxide obtained by hydrolysis and polycondensation of an organic or inorganic metal compound described in JP-A-6-35174 is preferably used. Among these coating layers, use of alkoxy compounds of silicon such as $Si(OCH_3)_4$, $Si(OC_2H_5)_4$, $Si(OC_3H_7)_4$, or $Si(OC_4H_9)_4$ is particularly preferable since these materials are inexpensive and readily available and the metal oxide coating layer obtained therefrom has excellent developing solution resistance.

The lithographic printing plate precursor prepared as described above is image-wise exposed, and then subjected to a development processing.

<Method for Making Lithographic Printing Plate>

A method for making a lithographic printing plate according to the invention includes: an exposure step of performing image-wise exposure to infrared of the above-described infrared-sensitive positive-type lithographic printing plate precursor of the present invention; and a development step of developing the exposed lithographic printing plate precursor using an alkaline aqueous solution with a pH of from 11.0 to 13.5 (preferably from 12.0 to 13.5, and more preferably from 12.5 to 13.5), in this order.

According to the method for making a lithographic printing plate according to the invention, the stability after exposure is improved. As a result, the obtained lithographic printing plate has high strength of the image area and excellent durability without generation of stain caused by the residual film in the non-image area.

Each step of the plate making is described in detail below.

<Exposure Step>

The process for making a lithographic printing plate of the present invention contains an exposure step of imagewise exposing the positive type lithographic printing plate precursor for infrared.

The actinic radiation light source used for imagewise exposure of the lithographic printing plate precursor of the invention is preferably a light source having an emission wavelength in the near-infrared to infrared region, and is more preferably a solid-state laser or a semiconductor laser. Among them, in the present invention, it is particularly preferable to carry out imagewise exposure using a solid-state laser or semiconductor laser that emits infrared radiation having a wavelength of 750 to 1,400 nm.

The laser output is preferably at least 100 mW, and in order to shorten the exposure time it is preferable to use a multibeam laser device. It is also preferable that the exposure time per pixel is within 20 μseconds.

The energy with which a lithographic printing plate precursor is irradiated is preferably 10 to 300 mJ/cm². When the energy is in this range, curing progresses sufficiently, laser ablation can be suppressed, and damage to an image can be prevented.

Exposure in the present invention may be carried out by making light beams of the light source overlap. Overlap means that the sub-scanning pitch width is smaller than the beam diameter. When the beam diameter is expressed as a full width half maximum (FWHM) of the beam intensity, the overlap may be expressed quantitatively using, for example, FWHM/sub-scanning pitch width (overlap factor). In the present invention, this overlap factor is preferably at least 0.1.

The scanning method of the light source of exposure equipment that can be used in the present invention is not particularly limited, and a cylinder outer face scanning method, a cylinder inner face scanning method, a flat face scanning method, etc. may be used. The light source channel may be single channel or multi channel, but in the case of the cylinder outer face method, multi channel is preferably used.

<Development Step>

Developing Solution

The method for making a lithographic printing plate according to the invention includes a development step of developing the lithographic printing plate precursor using an alkaline aqueous solution. The alkaline aqueous solution (hereinafter, also referred to as "a developing solution") used in the development step is an alkaline aqueous solution having a pH of from 11.0 to 13.5 (preferably from 12.0 to 13.5, and more preferably from 12.5 to 13.5). Herein, the pH is defined as the value obtained by measurement at room temperature (20° C.) using F-51 (trade name) manufactured by HORIBA, Ltd.

In the present invention, even in the case where a developing solution having a high pH is used, highly stabilized processing can be realized because the above-described particular surfactant is incorporated in a photosensitive layer in combination with the particular resin.

To be specific, an automatic processor (automatic developing machine) controls the alkali concentration in terms of conductivity. If the alkali concentration is maintained constant, the concentration of the surfactant necessary for development of the binder in the recording layer is increased or decreased by little and little. That is, this developing solution lacks stability of the processing.

In contrast, the present invention has the advantage that since the surfactant has preliminarily incorporated in the image recording layer of the lithographic printing plate precursor, the concentration of the surfactant is maintained constant from the initial period, even though the developing solution is controlled only by the alkali concentration.

Examples of the component that makes the developing solution alkaline include lithium, sodium, and potassium. Sodium is especially preferable. Carbonates of these components may be used. These components may be used singly, or in combination of two kinds or more.

Further, the developing solution preferably contains a surfactant, and more preferably contains at least an anionic surfactant or an amphoteric surfactant. The surfactant contributes to improving processability. The surfactant is preferably identical to the surfactant contained in the image recording layer of the lithographic printing plate precursor. This combination makes it possible to allow the surfactant in the image recording layer and the surfactant in the developing solution to interact with each other, thereby contributing to realization of further favorable developability and stability.

As for the surfactant used in the developing solution, any one of anionic surfactants, nonionic surfactants, cationic surfactants, and amphoteric surfactants may be used. As already described above, anionic surfactants or amphoteric (betaine-type) surfactants are preferable.

The anionic surfactant for use in the developing solution is not particularly limited and includes, for example, fatty acid salts, abietic acid salts, hydroxyalkanesulfonic acid salts, alkanesulfonic acid salts, dialkylsulfosuccinic acid salts, straight-chain alkylbenzenesulfonic acid salts, branched alkylbenzenesulfonic acid salts, alkylnaphthalenesulfonic acid salts, alkyldiphenylether (di)sulfonic acid salts, alkylphenoxy polyoxyethylene propylsulfonic acid salts, polyoxyethylene alkylsulfophenyl ether salts, N-methyl-N-oleyltaurine sodium salt, N-alkylsulfosuccinic acid monoamide disodium salts, petroleum sulfonic acid salts, sulfated castor oil, sulfated beef tallow oil, sulfate ester slats of fatty acid alkyl ester, alkyl sulfate ester salts, polyoxyethylene alkyl ether sulfate ester salts, fatty acid monoglyceride sulfate ester salts, polyoxyethylene alkyl phenyl ether sulfate ester salts, polyoxyethylene styryl phenyl ether sulfate ester salts, alkyl phosphate ester salts, polyoxyethylene alkyl ether phosphate ester salts, polyoxyethylene alkyl phenyl ether phosphate ester salts, partially saponified products of styrene-maleic anhydride copolymer, partially saponified products of olefin-maleic anhydride copolymer and naphthalene sulfonate formalin condensates. Of the compounds, alkylbenzenesulfonic acid salts, alkylnaphthalenesulfonic acid salts and alkyldiphenylether (di)sulfonic acid salts are particularly preferably used.

The nonionic surfactant for use in the developing solution is not particularly limited and includes, for example, polyethylene glycol type higher alcohol ethylene oxide adducts, alkylphenol ethylene oxide adducts, alkylnaphthol ethylene oxide adducts, phenol ethylene oxide adducts, naphthol ethylene oxide adducts, fatty acid ethylene oxide adducts, polyhydric alcohol fatty acid ester ethylene oxide adducts, higher alkylamine ethylene oxide adducts, fatty acid amide ethylene oxide adducts, ethylene oxide adducts of fat, polypropylene glycol ethylene oxide adducts, dimethylsiloxane-ethylene oxide block copolymers, dimethylsiloxane-(propylene oxide-ethylene oxide) block copolymers, fatty acid esters of polyhydric alcohol type glycerol, fatty acid esters of pentaerythritol, fatty acid esters of sorbitol and sorbitan, fatty acid esters of sucrose, alkyl ethers of polyhydric alcohols and fatty acid amides of alkanolamines. Of the compounds, those having an aromatic ring and an ethylene oxide chain are preferred, and alkyl-substituted or unsubstituted phenol ethylene oxide adducts and alkyl-substituted or unsubstituted naphthol ethylene oxide adducts are more preferred.

The amphoteric surfactant for use in the developing solution is not particularly limited and includes, for example, alkyldi(aminoethyl)glycine, alkylpolyaminoethyl glycine hydrochloride, 2-alkyl-N-carboxyethyl-N-hydroxyethyl imidazolinium betaine, and N-tetradecyl-N,N-betaine.

As for the surfactant used in the developing solution, anionic surfactants and amphoteric surfactants are preferable. Anionic surfactants containing a sulfonic acid or salt thereof are especially preferable.

Two or more kinds of the surfactant may be used in combination.

The content of the surfactant in the developing solution is preferably from 0.01 to 10 mass %, and more preferably from 0.01 to 5 mass %.

In order to maintain the pH of the developing solution in the favorable range, a carbonate ion and a bicarbonate ion are preferably present as buffers in the developing solution. This is likely due to that the carbonate and bicarbonate ions control the variation of the pH during long-time use of the developing solution, and thus prevent the deterioration of developability and the generation of developing residues caused by pH variation. In order to establish the presence of the carbonate and bicarbonate ions in the developing solution, a carbonate and a bicarbonate (or hydrogen carbonate) may be added to the developing solution, or the pH may be adjusted after the addition of a carbonate or bicarbonate, to generate carbonate and bicarbonate ions. The carbonate and bicarbonate are not particularly limited, but are preferably alkali metal salts. Examples of the alkali metal include lithium, sodium, and potassium. Among them, sodium is particularly preferred. They may be used alone, or in combination of two or more thereof.

The pH of the developing solution is not particularly limited, as long as it makes the developing solution developable, but preferably in a range of from 8.5 to 10.8.

The total amount of the carbonate and bicarbonate is preferably from 0.3 to 20% by mass, more preferably from 0.5 to 10% by mass, and particularly preferably from 1 to 5% by mass, with respect to the total mass of the developing solution. When the total amount is 0.3% by mass or more, the developability and processing ability do not deteriorate, and when the total amount is 20% by mass or less, precipitates or crystals are hardly formed, and gelation hardly occurs during neutralization for the treatment of the waste developing solution, so that the treatment is carried out smoothly.

The developing solution may each contain, in addition to the above-described components, other components such as an organic alkaline agent, a humectant, an antiseptic, a chelate compound, an anti-foaming agent, an organic acid, an organic solvent, a polar solvent, an inorganic acid, or an inorganic salt.

(Development Treatment)

The development temperature is not particularly limited as long as development is possible, but is preferably no higher than 60° C., and more preferably 15° C. to 40° C. In development processing using an automatic processor, since the developing solution might be exhausted depending on the amount processed, the processing performance may be recovered by use of a replenisher or fresh developing solution. As one example of development and post-development treatments, there is a method in which alkali development is carried out, the alkali is removed by a water washing post-step, a gumming treatment is carried out in a gumming step, and drying is carried out in a drying step. As another example, a method in which a water washing pre-step, a development step, and a gumming step are carried out at the same time using an aqueous solution containing carbonate ions, bicarbonate ions, and a surfactant can be cited as a preferred example. It is therefore preferable to carry out a drying step after carrying out a water washing pre-step, a development step, and a gumming step by the use of one solution and, furthermore, with one bath, without particularly carrying out a water washing pre-step. It is preferable to carry out drying subsequent to removal of extra developing solution using a squeegee roller, etc. after development.

It is more preferred that the development step be carried out using an automatic processor equipped with a rubbing member. Examples of the automatic processor include automatic processors as disclosed in JP-A-2-220061 and JP-A-60-59351, in which a lithographic printing plate precursor after image-wise exposure is subjected to rubbing treatment while being transferred, and automatic processors as disclosed in U.S. Pat. No. 5,148,746, U.S. Pat. No. 5,568,768, and U.K. Patent No. 2297719, in which a lithographic printing plate precursor after image-wise exposure is mounted on a cylinder, and subjected to rubbing treatment while the cylinder is rotated. Among them, an automatic processor having a rotary brush roll as a rubbing member is particularly preferred.

It is preferred that a continuous or discontinuous drying step be performed after the development step. The drying is carried out using, for example, hot air, infrared radiation, or far infrared rays.

As for the automatic processor favorably used in the method for making the lithographic printing plate according to the present invention, an apparatus equipped with a development unit and drying unit is used. The lithographic printing plate precursor was subjected to development and gumming treatment in a developing solution tank, and then dried in the drying unit to obtain a lithographic printing plate.

Furthermore, for the purpose of improving printing durability, etc., the printing plate after development may be heated under very severe conditions. The heating temperature may be usually from 200° C. to 500° C. When the temperature is low, sufficient image enhancement effect is not achieved, and when the temperature is too high, problems such as the deterioration of the support and pyrolysis of the image areas may occur.

The lithographic printing plate obtained in this manner is mounted on an offset printing machine, and used for printing a lot of sheets.

The lithographic printing plate precursor of the present invention realizes both high plate durability and high chemical resistance in the lithographic printing and also achieves good developability in the exposed area, suppression of a running residual, and a good concentration performance of a developing waste liquid at the same time. Further, the preparation method of the present invention makes it possible to produce the lithographic printing plate precursor that exhibits the above-described excellent performances.

EXAMPLES

The present invention will be described in more detail based on examples given below, but the invention is not meant to be limited by these.

Example I

Synthesis Example I-1

Into a 500 ml three-necked round-bottom flask equipped with a condenser and a stirrer, 2.7 g of 4,4'-diphenylmethane diisocyanate, 14.5 g of toluene-2,4-diisocyanate, 7.0 g of neopentyl glycol, 35.8 g of 2,2-bis(hydroxymethyl)propionic acid and 280 g of 3-pentanone were introduced. Further, 0.3 g of dibutyl tin didodecanoate was added, and then the temperature of the resultant reaction mixture was elevated to 80° C. by heating while stirring. The reaction was continued at 80° C. for 6 hours. Thus, Polyurethane (1) was obtained. The weight-average molecular weight measured by GPC was 24,000. The acid value was 125.

Synthesis Examples I-2 to I-9

Polyurethanes (2) to (9) were synthesized in the same manner as in Synthesis Example I-1, except that the diisocyanate compounds and the diol compounds were replaced with the diisocyanate compounds and the diol compounds shown in Table I-1 and the following formulae.

TABLE I-1

| Polyurethane | Diisocyanate compound | | | | Diol compound | | | | DI:DO | Mw* |
|---|---|---|---|---|---|---|---|---|---|---|
| | # | mole % | # | mole % | # | mole % | # | mole % | | |
| (2) | DI-1 | — | — | — | DO-1 | — | — | — | 1.5:1 | 7,000 |
| (3) | DI-1 | — | — | — | DO-1 | — | — | — | 1:1.2 | 12,000 |
| (4) | DI-2 | 75 | DI-3 | 25 | DO-1 | — | — | — | 1:1.1 | 17,000 |
| (5) | DI-1 | 80 | DI-3 | 20 | DO-3 | — | — | — | 1:1 | 23,000 |
| (6) | DI-1 | 75 | DI-3 | 25 | DO-1 | 75 | DO-4 | 25 | 1:1 | 25,000 |
| (7) | DI-1 | — | — | — | DO-1 | 85 | DO-2 | 15 | 1:1.05 | 20,000 |
| (8) | DI-1 | 75 | DI-4 | 25 | DO-1 | — | — | — | 1:1.05 | 19,000 |
| (9) | DI-1 | 80 | DI-3 | 20 | DO-1 | 85 | DO-5 | 15 | 1:1.1 | 18,000 |

*Mw: Molecular weight (weight average)

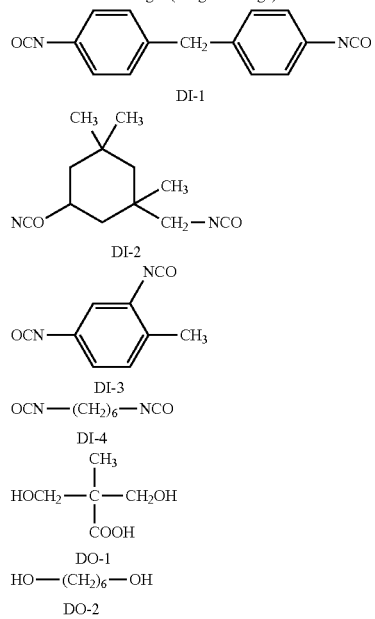

TABLE I-1-continued

| | Diisocyanate compound | | | | Diol compound | | | | | |
|---|---|---|---|---|---|---|---|---|---|---|
| Polyurethane | # | mole % | # | mole % | # | mole % | # | mole % | DI:DO | Mw* |

DO-3: HOCH₂—C(CH₂CH₃)(COOH)—CH₂OH $$HOCH_2-\underset{\underset{COOH}{|}}{\overset{\overset{CH_3}{|}}{\underset{|}{C}}}-CH_2OH$$

DO-3

HOCH₂—(cyclohexyl)—CH₂OH

DO-4

HOCH₂—(phenyl)—CH₂OH

DO-5

Example I-1 and Comparative Example I-1

Preparation of Support

The surface of a JIS A 1050 aluminum plate having a thickness of 0.3 mm was subjected to graining by means of a rotating nylon brush using a pumice-water suspension as an abrasive. Here, the surface roughness (center line average roughness) was 0.5 μm. After washing with water, the plate was immersed in a 10% sodium hydroxide aqueous solution, that had been heated to 70° C., and subjected to etching so that the amount of aluminum dissolved was 6 g/m³. After washing with water, the plate was immersed in a 30% nitric acid aqueous solution for 1 minute, so as to carry out neutralization, and washed well with water. Subsequently, it was subjected to electrolytic roughening for 20 seconds in a 0.7% nitric acid aqueous solution using a rectangular alternating waveform voltage with a voltage of 13 V for the anode and a voltage of 6 V for the cathode, immersed in a 20% sulfuric acid solution at 50° C., so as to wash the surface, and then washed with water. The roughened aluminum plate was subjected to formation of a porous anodized film using direct current in a 20% sulfuric acid aqueous solution. Electrolysis was carried out at an electric current density of 5 A/dm², and a substrate having on the surface an anodized film with a weight of 4.0 g/m² was formed by controlling the electrolysis time. This substrate was treated for 10 seconds in a vapor chamber that had been saturated at 100° C. and 1 atm, thus giving a substrate (b) with a sealing ratio of 60%. The substrate (b) was subjected to a surface hydrophilization treatment using a 2.5% by mass aqueous solution of sodium silicate at 30° C. for 10 seconds and then coated with undercoat solution 1 described below, and the coating film was dried at 80° C. for 15 seconds, thus giving a lithographic printing plate support [B]. The amount of coating after drying was 15 mg/m².

<Preparation of Undercoat Intermediate Layer>

The following coating solution for forming an intermediate layer was coated on the support [B] prepared as described above, and then dried at 80° C. for 15 seconds to provide an intermediate layer. The amount of coating after drying was 15 mg/m².

(Undercoat Solution 1)

| | |
|---|---|
| The following Copolymer having a weight-average molecular weight of 28,000 | 0.5 g |
| Methanol | 100 g |
| Water | 1 g |

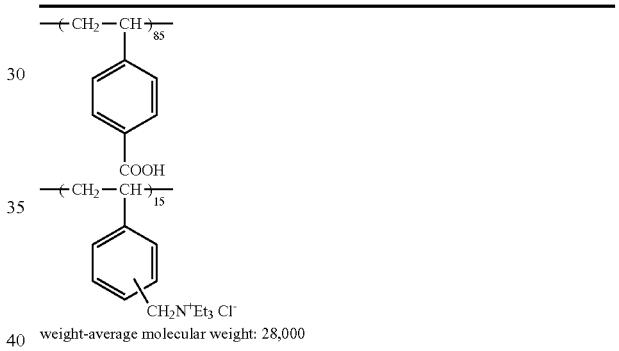

weight-average molecular weight: 28,000

<Formation of Recording Layer>

The undercoated support [B] thus obtained was provided with a lower layer by coating it with the photosensitive solution L1 for lower layer having the following composition using a wire bar and drying in a drying oven at 150° C. for 40 seconds, so as to give a coating amount of 1.3 g/m². After the lower layer was provided, an upper layer was provided by coating with the photosensitive solution U1 for upper layer having the following composition using a wire bar. After coating, drying was carried out at 150° C. for 40 seconds, thus giving a photosensitive lithographic printing plate precursor for infrared laser having the total coating amount for the lower layer and the upper layer of 1.7 g/m². This lithographic printing plate precursor has the multilayer structure as shown in FIG. 1.

(Photosensitive Solution L1 for Lower Layer) None of NVK (Novolac) Resin

| | |
|---|---|
| N-Phenylmaleimide/Methacrylic Acid/Methacrylamide copolymer (mass ratio: 59/15/25, Mw: 50,000) | 5.21 g |
| Infrared absorbing agent (The above-described cyanine dye A) | 0.94 g |
| Crystal Violet (manufactured by Hodogaya Chemical Co., Ltd) | 0.08 g |
| Methyl ethyl ketone | 61.00 g |
| Propylene glycol monomethyl ether | 14.00 g |
| γ-Butyrolactone | 9.40 g |
| Water | 0.03 g |

(Photosensitive Solution U1 for Upper Layer) None of IR Dye/none of NVK Resin

| | |
|---|---|
| Polyurethane (1) (25%, 3-pentanone solution) | 30.00 g |
| Ethyl Violet | 0.03 g |
| Surfactant described in Table I-2 | Content described in Table I-2 (mass %) |
| Fluorine-based surfactant (trade name: Megafac F-176, manufactured by DIC Corporation) | 0.05 g |
| 3-Pentanone | 62.40 g |
| Propylene glycol monomethylether-2-acetate | 7.37 g |

The thus-obtained lithographic printing plate precursor was subjected to the following evaluation. The results are shown in Table I-2.

<Evaluation of Running Residue>

40 m S/cm of initial conductivity and 45 m S/cm of equilibrium conductivity of a developing solution were input into a control section of an automatic processor.

The above-described plate for running was processed at a rate of average 50 prints per day for 1 month using the automatic processor. During this time, exposure was conducted in a manner such that the plate was overall exposed under the conditions of beam intensity of 9 w and drum rotation speed of 150 rpm using TRENDSETTER (trade name) manufactured by Creo Products Inc.

One month after the beginning of processing, a developing solution was removed from a developing solution tank, and the situation in the developing solution tank was examined by visual observation. As a result, no residue was found.

The criterion for the evaluation of running residue is as follows:

AA: The situation in which no or almost no developing residue is found by visual observation after the developing solution was removed from the developing solution tank.

B: The level at which a developing residue is easily found by visual observation after the developing solution was removed from the developing tank.

C: The level at which a developing residue is attached to a plate when the plate is passed through a developing solution without removing the developing solution from the developing solution tank.

<Evaluation of Film Wearing>

Evaluation of Film Wearing Caused by Development in the Exposed Area

An automatic processor LP-940H manufactured by FUJIFILM Corporation was loaded with a developing solution DT-2 (1:8 dilution) manufactured by FUJIFILM Corporation and a finisher FG-1 (1:1 dilution) manufactured by FUJIFILM Corporation. After that, using the automatic processor, the non-exposed lithographic printing plate precursor was subjected to a processing procedure under the conditions of developing temperature of 32° C. and developing time of 12 seconds. The conductivity of the developing solution at this time was 43 mS/cm.

Optical densities of the photosensitive layer before and after the development were measured. The film wearing caused by development was determined in terms of a relative density providing that a density before development, from which only the density of the aluminum plate is deducted, is 100%.

AA: 90% or more
A: 85% or more and less than 90%
B: 80% or more and less than 85%
C: less than 80%

<Evaluation of Printing Durability>

A test pattern was drawn imagewise on the lithographic printing plate precursor under the conditions of beam intensity of 9 w and drum rotation speed of 150 rpm using TRENDSETTER (trade name) manufactured by Creo Products Inc. Subsequently, it was developed using an LP940H PS processor manufactured by FUJIFILM Corporation charged with DT-2 developing solution (diluted so as to have an electrical conductivity of 43 mS/cm) manufactured by FUJIFILM Corporation at a development temperature of 30° C. for a development time of 12 seconds. This was used for continuous printing using a Lithron (trade name) printer manufactured by Komori Corporation. The number of sheets that could be printed with sufficient ink density was visually measured, and the printing durability was evaluated. The printing durability was expressed as a relative value when the number for the printing durability of Comparative Example cI-11 (no surfactant) was defined as 1.0. As the test pattern, a solid image (an overall image area) of 2 cm×2 cm was used. The number of print at the time when generation of graze and blank (or empty) was found by visual evaluation of the printed matter was defined as the print-ending number. At this time, "1.0" corresponded to 40,000 prints.

AA: 90% or more

A: 85% or more and less than 90%

B: 80% or more and less than 85%

C: less than 80%

<Evaluation of Waste Concentration Suitability>

20 liters of developing waste after running processing was concentrated with a defoamer: a 3% aqueous solution of AF-A manufactured by FUJIFILM Corporation (AF-A diluted with water) using a waste reduction apparatus XR-2000 manufactured by FUJIFILM Graphic Systems Co., Ltd.

Evaluation was conducted in terms of concentration rate and BOD value of the distilled reused water.

AA: The concentration rate is 4 times or more and the BOD value is less than 300 mg/L AA: concentration rate is 4 times or more, and BOD value is less than 300 mg/L A: concentration rate is 3 times or more and less than 4 times, and BOD value is less than 300 mg/L B: concentration rate is 2 times or more and less than 3 times, and BOD value is less than 300 mg/L C: concentration rate is less than 2 times, and BOD value is less than 300 mg/L D: concentration rate is less than 2 times, and BOD value is 300 mg/L or more (Developing Solution)

| | |
|---|---|
| D-Sorbit | 2.5 mass % |
| Sodium hydroxide | 0.85 mass % |
| Polyethylene glycol lauryl ether (weight average molecular weight: 1,000) | 0.5 mass % |
| Water | 96.15 mass % |

TABLE I-2

| No.[2] I-2 | Surfactant | Content[1] Mass % | Running residue | Film wearing | Plate durability | Concentration |
|---|---|---|---|---|---|---|
| 101 | SOFTAZOLINE LPB-R | 3% | B | AA | AA | B |
| 102 | | 5% | AA | AA | AA | AA |
| 103 | | 10% | AA | AA | AA | AA |
| 104 | | 15% | AA | B | B | AA |
| 105 | SOFTAZOLINE LAO | 3% | B | AA | AA | B |
| 106 | | 5% | AA | AA | AA | AA |
| 107 | | 10% | AA | AA | AA | AA |
| 108 | | 15% | AA | B | B | AA |
| 109 | NEWCOL B4SN | 3% | B | AA | AA | B |
| 110 | | 5% | AA | A | A | A |
| 111 | | 10% | AA | A | A | A |
| 112 | | 15% | AA | B | B | A |
| 113 | PELEX NBL | 3% | B | AA | AA | B |
| 114 | | 5% | AA | A | A | A |
| 115 | | 10% | AA | A | A | A |
| 116 | | 15% | AA | B | B | A |
| c11 | None | None | C | AA | AA | C |
| c12 | Triethanolamine | 5% | C | AA | AA | D |
| c13 | | 10% | C | AA | AA | D |

SOFTAZOLINE LPB-R: trade name, amide betaine-type amphoteric surfactant, manufactured by Kawaken Fine Chemicals Co., Ltd.
SOFTAZOLINE LAO: trade name, amide amine oxide-type amphoteric surfactant, manufactured by Kawaken Fine Chemicals Co., Ltd.
NEWCOL B4SN: trade name, anionic surfactant, manufactured by Nippon Nyukazai Co., Ltd., R—O—$(CH_2CH_2O)_n$—$SO_3Na$ (R: aryl group, n: integer)
PELEX NBL: trade name, anionic surfactant, manufactured by Kao Corporation, Sodium Alkylnaphthalenesulfonate
[1]It means the content with respect to the total solid content of the recording layer containing a surfactant. The same goes for the following tables.
[2]Test Examples having the number beginning with "c" mean Comparative Examples. The same goes for the following Examples and Comparative Examples.

As is apparent from the above Table, the lithographic printing plate precursors of the present invention drastically improve the running residue and have satisfactory performances without the film wearing, and also exhibit high-plate durability, when compared to those of Comparative Examples. From these results, it is seen that the lithographic printing plate precursors having the recording layer that contains the amphoteric surfactant or the anionic surfactant according to the present invention make it possible to realize good developability in addition to high-plate durability.

Example I-2 and Comparative Example I-2

Evaluation was conducted in terms of running residue, film wearing, and plate durability in the same manner as in the above-described Example I-1, except that the polyurethane used was changed from Polyurethane (1) to Polyurethanes (2) to (9), respectively. As a result, it was confirmed that the lithographic printing plate precursors having used the amphoteric surfactant or the anionic surfactant (Examples), in any case of using the above polyurethanes, exhibited the same good performances as those of Example I-1, when compared to the lithographic printing plate precursors free of the amphoteric surfactant or the anionic surfactant (Comparative Examples).

Example I-3 and Comparative Example I-3

In the above, Examples in which the particular polyurethane and the amphoteric surfactant or the anionic surfactant are contained together in the upper layer were described. Further, it was confirmed that the embodiments of the present invention modified as shown in the following Table I-3 also exhibited effects as high as those of the above-described Examples I-1 and I-2. That is, the lithographic printing plate precursors of the present invention exhibited good effects on running residue, film wearing, and plate durability, when compared to Comparative Examples. It is seen that the lithographic printing plate precursors having used the amphoteric surfactant or the anionic surfactant (Examples) exhibited good performances in terms of a good balance between developability and plate durability, when compared to the lithographic printing plate precursors free of the amphoteric surfactant or the anionic surfactant (Comparative Examples). The results are shown together below. Note that the comparative experiments were conducted in each experiment such that the anionic surfactant or the amphoteric surfactant was used in the amount of 10% by mass.

(Photosensitive Solution L2 for Lower Layer) with NVK Resin

| | |
|---|---|
| The above-described polyurethane (1) | 4.17 g |
| The above-described cyanine dye A | 0.94 g |
| Crystal Violet (manufactured by Hodogaya Chemical Co., Ltd.) | 0.08 g |
| m,p-Cresol novolac resin (m/p = 6/4, Mw = 3500) | 1.04 g |
| Methyl ethyl ketone | 61.00 g |
| Propylene glycol monomethyl ether | 14.00 g |
| γ-Butyrolactone | 9.40 g |
| Water | 0.03 g |

(Photosensitive Solution U2 for Upper Layer) with IR Dye/with NVK Resin

| | |
|---|---|
| Polyurethane (1) (25%, 3-pentanone solution) | 30.00 g |
| The above-described cyanine dye A | 0.15 g |
| Ethyl Violet (manufactured by Hodogaya Chemical Co., Ltd.) | 0.03 g |
| Surfactant described in Table I-3 | 10 mass % |
| Fluorine-based surfactant (trade name: Megafac F-176, manufactured by DIC Corporation) | 0.05 g |
| 3-Pentanone | 62.40 g |
| Propylene glycol monomethylether-2-acetate | 7.37 g |

(Photosensitive Solution U3 for Upper Layer) with IR Dye/ with NVK Resin

| | |
|---|---|
| Polyurethane (1) (25%, 3-pentanone solution) | 24.00 g |
| The above-described cyanine dye A | 0.15 g |
| Ethyl Violet (manufactured by Hodogaya Chemical Co., Ltd.) | 0.03 g |
| Surfactant described in Table I-3 | 10 mass % |
| Fluorine-based surfactant (trade name: Megafac F-176, manufactured by DIC Corporation) | 0.05 g |
| m,p-Cresol novolac resin (m/p = 6/4, Mw = 3500) | 1.50 g |
| 3-Pentanone | 62.40 g |
| Propylene glycol monomethylether-2-acetate | 7.37 g |

TABLE I-3

| No *2 I-3 | PL *3 UL | PL *3 LL | Surfactant | Content *1 Mass % | Running residue | Film wearing | Plate durability | Concentration |
|---|---|---|---|---|---|---|---|---|
| 301 | U1 | L2 | SOFTAZOLINE LPB-R | 10% | AA | AA | AA | AA |
| 302 | | | SOFTAZOLINE LAO | 10% | AA | AA | AA | AA |
| 303 | | | NEWCOL B4SN | 10% | AA | A | A | A |
| 304 | | | PELEX NBL | 10% | AA | A | A | A |
| c31 | | | Triethanolamine | 10% | C | AA | AA | D |
| 311 | U2 | L1 | SOFTAZOLINE LPB-R | 10% | AA | AA | AA | AA |
| 312 | | | SOFTAZOLINE LAO | 10% | AA | AA | AA | AA |
| 313 | | | NEWCOL B4SN | 10% | AA | A | A | A |
| 314 | | | PELEX NBL | 10% | AA | A | A | A |
| c32 | | | Triethanolamine | 10% | C | AA | AA | D |
| 321 | U2 | L2 | SOFTAZOLINE LPB-R | 10% | AA | AA | AA | AA |
| 322 | | | SOFTAZOLINE LAO | 10% | AA | AA | AA | AA |
| 323 | | | NEWCOL B4SN | 10% | AA | A | A | A |
| 324 | | | PELEX NBL | 10% | AA | A | A | A |
| c33 | | | Triethanolamine | 10% | C | AA | AA | D |
| 331 | U3 | L1 | SOFTAZOLINE LPB-R | 10% | AA | AA | AA | AA |
| 332 | | | SOFTAZOLINE LAO | 10% | AA | AA | AA | AA |
| 333 | | | NEWCOL B4SN | 10% | AA | A | A | A |
| 334 | | | PELEX NBL | 10% | AA | A | A | A |
| c34 | | | Triethanolamine | 10% | C | AA | AA | D |
| 341 | U3 | L2 | SOFTAZOLINE LPB-R | 10% | AA | AA | AA | AA |
| 342 | | | SOFTAZOLINE LAO | 10% | AA | AA | AA | AA |
| 343 | | | NEWCOL B4SN | 10% | AA | A | A | A |
| 344 | | | PELEX NBL | 10% | AA | A | A | A |
| c35 | | | Triethanolamine | 10% | C | AA | AA | D |

*1, and *2 same as above table I-2.

*3 PL: Photosensitive Solution, UL: Upper layer, LL: Lower layer

Example II

Example II-1 and Comparative Example II-1

Preparation of Support

The preparation of the lithographic printing plate precursors was conducted in the same manner as Example I, except that the following photosensitive solutions were used. The performance evaluation was also conducted in the same manner as Example I.

(Photosensitive Solution I for Lower Layer)

| | |
|---|---|
| Particular maleimide A (Copolymer 1) | 3.5 g |
| Dye in which the counteranion of Ethyl Violet was 6-hydroxy-β-naphthalenesulfonic acid ion | 0.15 g |
| Infrared absorbing agent (The above-described cyanine dye A) | 0.25 g |
| Bisphenol sulfone | 0.3 g |
| Tetrahydro phthalic acid | 0.4 g |
| Fluorine-based surfactant (trade name: Megafac F-780, manufactured by DIC Corporation) | 0.02 g |
| Methyl ethyl ketone | 30 g |
| Propylene glycol monomethyl ether | 15 g |
| γ-Butyrolactone | 15 g |
| Surfactant described in Table II-1 | Content described in Table II-1 (mass %) |

* Copolymer 1: the copolymer containing 35% by mole of N-phenylmaleimide, 30% by mole of methacrylic acid and 35% by mole of N-[2-(2-oxo-1-imidazolidinyl)ethyl]methacrylamide as components thereof (Photosensitive Solution II for Upper Layer)

| | |
|---|---|
| Novolac resin (m-cresol/p-cresol/phenol = 3/2/5, Mw8,000) | 0.68 g |
| Infrared absorbing agent (The above-described cyanine dye A) | 0.045 g |
| Fluorine-based surfactant (trade name: Megafac F-780, manufactured by DIC Corporation) | 0.03 g |
| Methyl ethyl ketone | 15.0 g |
| 1-Methoxy-2-propanol | 30.0 g |

Evaluation of the obtained lithographic printing plate precursors was conducted in the same manner as Example I. The results are shown in Table II-1.

TABLE II-1

| NO.*² II-1 | Surfactant | Content Mass %*¹ | Running residue | Film wearing | Plate durability | Concentration |
|---|---|---|---|---|---|---|
| 101 | SOFTAZOLINE LPB-R | 3% | B | AA | AA | B |
| 102 | | 5% | AA | AA | AA | AA |
| 103 | | 10% | AA | AA | AA | AA |
| 104 | | 15% | AA | B | B | AA |
| 105 | SOFTAZOLINE LAO | 3% | B | AA | AA | B |
| 106 | | 5% | AA | AA | AA | AA |
| 117 | | 10% | AA | AA | AA | AA |
| 118 | | 15% | AA | B | B | AA |
| 119 | NEWCOL B4SN | 3% | B | AA | AA | B |
| 120 | | 5% | AA | A | A | A |
| 121 | | 10% | AA | A | A | A |
| 122 | | 15% | AA | B | B | A |
| 123 | PELEX NBL | 3% | B | AA | AA | B |
| 124 | | 5% | AA | A | A | A |
| 125 | | 10% | AA | A | A | A |
| 126 | | 15% | AA | B | B | A |
| c11 | None | None | C | AA | AA | C |
| c12 | Triethanolamine | 5% | C | AA | AA | D |
| c13 | | 10% | C | AA | AA | D |

As is apparent from the above Table, the lithographic printing plate precursors of the present invention drastically improve the running residue and have satisfactory performances without the film wearing, and also exhibit high-plate durability, when compared to those of Comparative Examples. From these results, it is seen that the lithographic printing plate precursors having the recording layer that contains the amphoteric surfactant or the anionic surfactant according to the present invention make it possible to realize good developability in addition to high-plate durability.

Example II-2 and Comparative Example II-2

Evaluation was conducted in terms of running residue, film wearing, and plate durability in the same manner as in the above-described Example II-1, except that the specific maleimide resin A was changed from Copolymer 1 to Copolymers 1 and 3, respectively. As a result, it was confirmed that the lithographic printing plate precursors having used the amphoteric surfactant or the anionic surfactant (Examples), in any case of using the above maleimide resins, exhibited the same good performances as those of Example II-1, when compared to the lithographic printing plate precursors free of the amphoteric surfactant or the anionic surfactant (Comparative Examples). The results are given in Table II-2.

Copolymer 2: the copolymer containing 35% by mole of N-phenylmaleimide, 30% by mole of methacrylic acid and 35% by mole of N-[2-(2-oxo-1-imidazolinyl)ethyl]methacrylamide as components thereof Copolymer 3: the copolymer containing 35% by mole of N-benzylmaleimide, 30% by mole of methacrylic acid and 35% by mole of N-[2-(2-oxo-1-imidazolidinyl)ethyl]methacrylamide as components thereof

TABLE II-2

| NO.*² II-2 | Copolymer | Surfactant | Content Mass %*¹ | Running residue | Film wearing | Plate durability | Concentration |
|---|---|---|---|---|---|---|---|
| 201 | #2 | SOFTAZOLINE LPB-R | 10% | AA | AA | AA | AA |
| 202 | | SOFTAZOLINE LAO | 10% | AA | AA | AA | AA |
| 203 | | NEWCOL B4SN | 10% | AA | AA | AA | AA |
| 204 | | PELEX NBL | 10% | AA | AA | AA | AA |
| c21 | | Triethanolamine | 5% | C | AA | AA | D |
| 211 | #3 | SOFTAZOLINE LPB-R | 10% | AA | AA | AA | AA |
| 212 | | SOFTAZOLINE LAO | 10% | AA | AA | AA | AA |
| 213 | | NEWCOL B4SN | 10% | AA | AA | AA | AA |
| 214 | | PELEX NBL | 10% | AA | AA | AA | AA |
| c22 | | Triethanolamine | 5% | C | AA | AA | D |

Example II-3 and Comparative Example II-3

In the above, Examples in which the maleimide resin A and the amphoteric surfactant or the anionic surfactant are contained together in the lower layer were described. Further, it was confirmed that the embodiments of the present invention modified as shown in the above Table B also exhibited effects as high as those of the above-described Examples II-1 and II-2. That is, the lithographic printing plate precursors of the present invention exhibited good effects on running residue, film wearing, and plate durability, when compared to Comparative Examples. It is seen that the lithographic printing plate precursors having used the amphoteric surfactant or the anionic surfactant (Examples) exhibited good performances in terms of a good balance between developability and plate durability, when compared to the lithographic printing plate precursors free of the amphoteric surfactant or the anionic surfactant (Comparative Examples).

Example III

Synthesis Example III-1

Polymer A (poly (vinyl acetal) resin) was prepared in accordance with the following steps:

BF-03 (50 g) was added to a reaction vessel equipped with a water-cooled condenser, a drip funnel and a thermometer, the vessel containing DMSO (200 g). While continuously stirring, the mixture was heated at 80° C. for 30 minutes until the mixture became a transparent solution. Next, the temperature was adjusted to 60° C., and MSA (2.7 g) in DMSO (50 g) was added. Then, a butyl aldehyde (10.4 g) solution was added to the reaction mixture over 15 minutes, and then the reaction mixture was kept at the temperature of from 55° C. to 60° C. for 1 hour. Next, 2-hydroxybenzaldehyde (salicylaldehyde, 39 g) in DMSO (100 g) was added to the reaction mixture. Next, the reaction mixture was diluted with anisole (350 g) and vacuum distillation was started. The anisotropic mixture of anisole and water was distilled away from the reaction mixture (the residual amount of water in the solution was less than 0.1%). Then, the reaction mixture was cooled down to room temperature, and then neutralized with TEA (8 g) dissolved in DMSO (30 g), and then blended with 6 kg of water. Resultantly, the deposited polymer was washed with water and filtrated, and then vacuum-dried at 50° C. for 24 hours to obtain 80 g of dried polymer A.

BF-03 represents polyvinyl alcohol (98% hydrolyzed, Mw=15,000) obtained from Chang Chun Petrochemical Co., Ltd. (Taiwan).
MSA stands for methanesulfonic acid (99%).
DMSO stands for dimethyl sulfoxide.
TEA stands for triethanol amine.

Example III-1 and Comparative Example III-1

The photosensitive compositions of the Example and the Comparative Example were produced as described below.

| | |
|---|---|
| Polymer A | 7.22 g |
| Crystal Violet | 0.20 g |
| S 0094 IR dye | 0.16 g |
| Surfactant described in Table III-1 | Content described in Table III-1 |
| PM (1-methoxy-2-propanol) | 91.8 g |

Each composition was filtrated and applied to an aluminum plate in accordance with an ordinary method, the aluminum plate having been electrochemically roughened and anodized, and further subjected to a treatment with a poly(vinylsulfonic acid) aqueous solution. The obtained coating for image forming layer was dried at 105° C. for 2.5 hours in a Unigraph Quartz oven manufactured by Glunz & Jensen. The dried coating amount of each image forming layer was 1.5 g/m².

Evaluation of the obtained lithographic printing plate precursors was conducted in the same manner as Example I. The results are shown in Table III-1.

TABLE III-1

| NO.[*2] III-1 | Surfactant | Content Mass %[*1] | Running residue | Film wearing | Plate durability | Concentration |
|---|---|---|---|---|---|---|
| 101 | SOFTAZOLINE LPB-R | 3% | B | AA | AA | B |
| 102 | | 5% | AA | AA | AA | AA |
| 103 | | 10% | AA | AA | AA | AA |
| 104 | | 15% | AA | B | B | AA |
| 105 | SOFTAZOLINE LAO | 3% | B | AA | AA | B |
| 106 | | 5% | AA | AA | AA | AA |
| 107 | | 10% | AA | AA | AA | AA |
| 108 | | 15% | AA | B | B | AA |
| 109 | | 20% | AA | B | B | AA |
| 110 | NEWCOL B4SN | 3% | B | AA | AA | B |
| 111 | | 5% | AA | A | A | A |
| 112 | | 10% | AA | A | A | A |
| 113 | | 15% | AA | B | B | A |
| 114 | | 20% | AA | B | B | A |
| 115 | PELEX NBL | 3% | B | AA | AA | B |
| 116 | | 5% | AA | A | A | A |
| 117 | | 10% | AA | A | A | A |
| 118 | | 15% | AA | B | B | A |
| c11 | None | None | C | AA | AA | C |
| c12 | Triethanolamine | 5% | C | AA | AA | D |
| c13 | | 10% | C | AA | AA | D |

Example III-2 and Comparative Example III-2

Preparation of Support

A support was prepared by subjecting a 0.3 mm thick JIS A 1050 aluminum plate to the treatments below.

(a) Mechanical Roughening Treatment

The surface of the aluminum plate was subjected to a mechanical roughening treatment by means of a rotating roll-shaped nylon brush while supplying a suspension of an abrasive (silica sand) having a specific gravity of 1.12 in water as an abrasive slurry to the surface of the aluminum plate. The abrasive had an average particle size of 8 μm and the maximum particle size of 50 μm. The material of the nylon brush was 6,10-nylon, the bristle length was 50 mm, and the diameter of the bristles was 0.3 mm. The nylon brush was formed by making holes in a stainless steel tube having a diameter of 300 mm and densely implanting the bristles. Three rotating brushes were used. The distance of two support rollers (φ200 mm) below the brushes was 300 mm. The brush rollers were pressed against the aluminum plate so that the load on a drive motor for rotating the brushes increased by 7 kW from the load before pressing the brush rollers. The direction of rotation of the brushes was the same as the direction in which the aluminum plate traveled. The rotational speed of the brushes was 200 rpm.

(b) Alkali Etching Treatment

The aluminum plate obtained above was subjected to an etching treatment by spraying an NaOH aqueous solution (concentration 26% by mass, aluminum ion concentration 6.5% by mass) at 70° C. so as to dissolve 6 g/m² of the aluminum plate. Thereafter, the aluminum plate is washed by spraying well water.

(c) Desmutting Treatment

A desmutting treatment was carried out by means of a spray using a 30° C. aqueous solution having a nitric acid concentration of 1% by mass (containing 0.5% by mass of aluminum ion), and then the aluminum plate is washed by spraying well water. As the aqueous nitric acid solution used for the desmutting, the waste solution from the step of performing electrochemical surface roughening by using AC (alternating current) in an aqueous nitric acid solution is used.

(d) Electrochemical Roughening Treatment

An electrochemical roughening treatment was carried out consecutively using an AC voltage of 60 Hz. The electrolytic liquid in this treatment was a 10.5 g/L aqueous solution of nitric acid (containing 5 g/L of aluminum ion), and the temperature was 50° C. The electrochemical roughening treatment was carried out using as an AC power source waveform a trapezoidal rectangular wave alternating current having a duty ratio of 1:1 and a time TP from zero to peak current value of 0.8 mseconds, with a carbon electrode as a counter electrode. Ferrite was used as an auxiliary anode. The electrolytic vessel used was of a radial cell type. The current density was 30 A/dm$^2$ as a peak current value, and the quantity of electricity was 220 C/dm$^2$ as the total quantity of electricity when the aluminum plate was the anode. 5% of the current flowing from the power source was diverted to the auxiliary anode.

Thereafter, the aluminum plate is washed by spraying well water.

(e) Alkali Etching Treatment

The aluminum plate was subjected to an etching treatment at 32° C. by means of a spray with a sodium hydroxide concentration of 26% by mass and an aluminum ion concentration of 6.5% by mass so as to dissolve 0.20 g/m$^2$ of the aluminum plate, remove a smut component containing aluminum hydroxide as a main component formed in the previous stage when carrying out the electrochemical roughening treatment using alternating current, and dissolve an edge portion of a pit formed to thus make the edge portion smooth. Thereafter, the aluminum plate was washed by spraying well water.

(f) Desmutting Treatment

A desmutting treatment was carried out by means of a spray using an aqueous solution having a nitric acid concentration of 15% by mass and a temperature of 30° C. (containing 4.5% by mass of aluminum ion), and then the aluminum plate is washed by spraying well water. As the aqueous nitric acid solution used for the desmutting, the waste solution from the step of performing electrochemical surface roughening by using AC in an aqueous nitric acid solution was used.

(g) Electrochemical Roughening Treatment

An electrochemical roughening treatment was carried out consecutively using an AC voltage of 60 Hz. The electrolytic liquid in this process was a 7.5 g/L aqueous solution of hydrochloric acid (containing 5 g/L of aluminum ion), and the temperature was 35° C. The alternating current waveform of the power source was a rectangular wave, and the electrochemical roughening treatment was carried out using a carbon electrode as a counter electrode. Ferrite was used as an auxiliary anode. The electrolytic vessel was of a radial cell type.

The current density was 25 A/dm$^2$ as a peak current value, and the quantity of electricity was 50 C/dm$^2$ as the total quantity of electricity when the aluminum plate was the anode.

Thereafter, the aluminum plate was washed by spraying well water.

(h) Alkali Etching Treatment

The aluminum plate was subjected to an etching treatment at 32° C. by means of a spray with a sodium hydroxide concentration of 26% by mass and an aluminum ion concentration of 6.5% by mass so as to dissolve 0.10 g/m$^2$ of the aluminum plate, remove a smut component containing aluminum hydroxide as a main component formed in the previous stage when carrying out the electrochemical roughening treatment using alternating current, and dissolve an edge portion of a pit formed to thus make the edge portion smooth. Thereafter, the aluminum plate was washed by spraying well water.

(i) Desmutting Treatment

A desmutting treatment was carried out by means of a spray using a 60° C. aqueous solution having a sulfuric acid concentration of 25% by mass (containing 0.5% by mass of aluminum ion), and then the aluminum plate was washed by spraying well water.

(j) Anodizing Treatment

As an electrolytic liquid, sulfuric acid was used. The electrolytic liquid had a sulfuric acid concentration of 170 g/L (containing 0.5% by mass of aluminum ion), and the temperature was 43° C. Thereafter, the aluminum plate was washed by spraying well water.

The current density was about 30 A/dm$^2$. The final amount of oxide film was 2.7 g/m$^2$.

Each of the above-described steps (a) to (j) was performed in sequence to prepare a support. The thus-obtained support was successively subjected to the following hydrophilicity-imparting treatment and the following undercoating treatment.

(k) Alkali Metal Silicate Treatment

The aluminum plate obtained by the anodizing treatment was immersed in a treatment bath with a 1% by mass aqueous solution of No. 3 sodium silicate at a temperature of 30° C. for 10 seconds, thus carrying out an alkali metal silicate treatment (silicate treatment). Thereafter, the aluminum plate is washed by spraying well water. The amount of silicate attached was 3.6 mg/m$^2$.

(Undercoating Treatment)

An undercoat layer was provided by coating the thus-obtained aluminum plate having been subjected to the alkali metal silicate treatment with the following coating solution for undercoat layer and then drying at 80° C. for 15 seconds.

The coating amount after drying was 15 mg/m$^2$.

(Coating Solution for Undercoat Layer)

| | |
|---|---|
| The following polymeric compound (formula (I) described below) | 0.3 g |
| Methanol | 100 g |
| Water | 1 g |

(I)

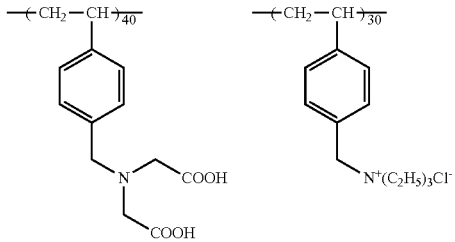

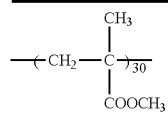

Mw: 26,000

(Formation of Recording Layer)

The thus-obtained support (aluminum plate) having thereon the undercoat layer was provided with a lower layer by coating it with the following coating solution A for lower layer using a wire bar and drying in a 140° C. drying oven for 50 seconds, so as to give a coating amount of 0.85 g/m².

After the lower layer was provided, an upper layer was provided by coating with the following coating solution B for upper layer using a wire bar. After coating, drying was carried out at 140° C. for 60 seconds, thus giving a positive-type lithographic printing plate precursor of Examples and Comparative Examples having a total coating amount for the lower layer and the upper layer of 1.1 g/m².

<Coating Solution A for Lower Layer>

| | |
|---|---|
| Polymer A | 2.13 g |
| Surfactant described in Table III-2 | Content described in Table III-2 |
| The above-described cyanine dye A | 0.134 g |
| Bis(p-hydroxyphenyl) sulfone | 0.126 g |
| Tetrahydrophthalic Anhydride | 0.19 g |
| p-Toluenesulfonic acid | 0.008 g |
| 2-Methoxy-4-(N-phenylamino) benzene diazonium hexafluorophosphate | 0.032 g |
| Ethyl violet 6-naphthalene sulfonic acid | 0.078 g |
| Fluorine-based surfactant (trade name: Megafac F-780, manufactured by DIC Corporation) | 0.023 g |
| γ-Butyrolactone | 13.16 g |
| Methyl ethyl ketone | 25.39 g |
| 1-Methoxy-2-propanol | 12.95 g |

<Coating Solution B for Upper Layer>

| | |
|---|---|
| m-Cresol/p-Cresol novolac (m/p ratio = 60/40, weight average molecular weight: 4000) | 0.341 g |
| The above-described cyanine dye A | 0.019 g |
| Polymer 1 having the following structure/ 30% MEK solution (the following structure) | 0.14 g |
| Quaternary ammonium salt (the following structure) | 0.004 g |
| Fluorine-based surfactant (trade name: Megafac F-780, manufactured by DIC Corporation) | 0.004 g |
| Fluorine-based surfactant (trade name: Megafac F-781, manufactured by DIC Corporation) | 0.001 g |
| Methyl ethyl ketone | 2.63 g |
| 1-Methoxy-2-propanol | 5.27 g |

Polymer-1

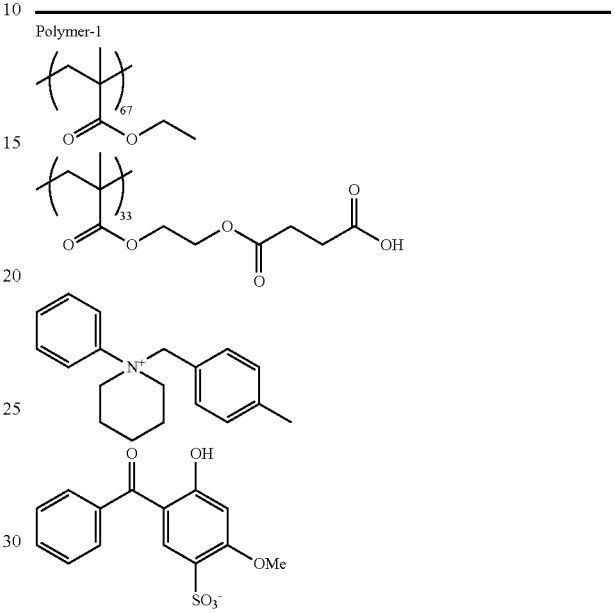

The thus-obtained lithographic printing plate precursor was subjected to the following evaluation. The results are shown in Table 2.

(Developing Solution)

| | |
|---|---|
| D-Sorbit | 2.5 mass % |
| SOFTAZOLINE LAO (30% solution) | 12 mass % |
| Sodium hydroxide | 0.85 mass % |
| Polyethylene glycol lauryl ether (weight average molecular weight: 1,000) | 0.5 mass % |
| Water | 84.15 mass % |

TABLE III-2

| NO.*2 III-2 | Surfactant | Content Mass %*1 | Running residue | Film wearing | Plate durability | Concentration |
|---|---|---|---|---|---|---|
| 201 | SOFTAZOLINE LPB-R | 3% | B | AA | AA | B |
| 202 | | 5% | A | AA | AA | A |
| 203 | | 10% | AA | AA | AA | AA |
| 204 | | 15% | AA | B | A | AA |
| 205 | SOFTAZOLINE LAO | 3% | B | AA | AA | B |
| 206 | | 5% | A | AA | AA | A |
| 207 | | 10% | AA | AA | AA | AA |
| 208 | | 15% | AA | A | B | AA |
| 209 | | 20% | AA | B | B | AA |
| 210 | NEWCOL B4SN | 3% | B | AA | AA | B |
| 211 | | 5% | AA | AA | AA | A |
| 212 | | 10% | AA | AA | A | A |
| 213 | | 15% | AA | AA | B | A |
| 214 | | 20% | AA | B | B | A |
| 215 | PELEX NBL | 3% | B | AA | AA | B |
| 216 | | 5% | AA | AA | AA | AA |
| 217 | | 10% | AA | AA | A | A |
| 218 | | 15% | AA | B | B | A |
| c21 | None | None | C | AA | AA | D |

TABLE III-2-continued

| NO.*2 III-2 | Surfactant | Content Mass %*1 | Running residue | Film wearing | Plate durability | Concentration |
|---|---|---|---|---|---|---|
| c22 | Triethanolamine | 5% | C | AA | AA | D |
| c23 | | 10% | C | AA | AA | D |

Example III-3 and Comparative Example III-3

Evaluation was conducted in terms of running residue, film wearing, and plate durability in the same manner as in the above-described Example III-2, except that the acetal resin used was changed from Polymer A to Polymers B to I, respectively. The results are shown in Table 3.

Details of the Polymers B to I are described below.

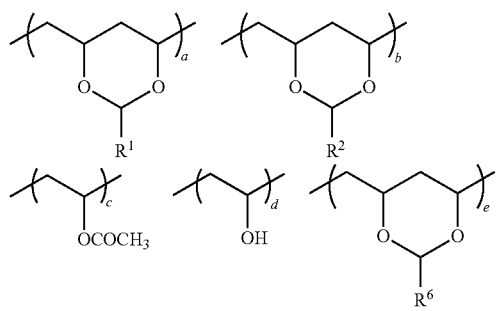

Polymer B: (a/b/c/d/e=36/37/2/25/0; weight average molecular weight: 16,000)
  $R^1$=n-butyl group, $R^2$=4-hydroxybenzyl group
Polymer C: (a/b/c/d/e=12/49/17/22/0; weight average molecular weight: 14,000)
  $R^1$=n-butyl group, $R^2$=3-hydroxybenzyl group
Polymer D: (a/b/c/d/e=30/39/2/20/9; weight average molecular weight: 18,000)
  $R^1$=n-butyl group, $R^2$=2-hydroxybenzyl group, $R^6$=glyoxylic acid group
Polymer E: (a/b/c/d/e=21/43/2/24/10; weight average molecular weight: 16,000)
  $R^1$=n-butyl group, $R^2$=3-hydroxybenzyl group, $R^6$=propargyl group
Polymer F: (a/b/c/d/e=38/42/2/18/0; weight average molecular weight: 18,000)
  $R^1$=n-butyl group, $R^2$=2-hydroxybenzyl group
Polymer G: (a/b/c/d/e=25/38/12/25/0; weight average molecular weight: 16,000)
  $R^1$=n-butyl group, $R^2$=4-hydroxybenzyl group
Polymer H: (a/b/c/d/e=16/10/12/44/18; weight average molecular weight: 18,000)
  $R^1$=isovaleryl group, $R^2$=2-hydroxybenzyl group, $R^6$=4-formylphenoxyacetic acid group
Polymer I: (a/b/c/d/e=14/44/2/40/0; weight average molecular weight: 16,000)
  $R^1$=n-butyl group, $R^2$=3,5-dibromo-4-hydroxybenzyl group The thus-obtained lithographic printing plate precursor was subjected to the following evaluation. The results are shown in Table III-3.

(Developing Solution)

| D-Sorbit | 2.5 mass % |
|---|---|
| SOFTAZOLINE LAO (30% solution) | 12 mass % |
| Sodium hydroxide | 0.85 mass % |
| Polyethylene glycol lauryl ether (weight average molecular weight: 1,000) | 0.5 mass % |
| Water | 84.15 mass % |

TABLE III-3

| NO.*2 III-3 | Polymer | Surfactant | Content Mass %*1 | Running residue | Film wearing | Plate durability | Concentration |
|---|---|---|---|---|---|---|---|
| 301 | B | SOFTAZOLINE LPB-R | 5% | A | AA | AA | A |
| 302 | C | SOFTAZOLINE LPB-R | 5% | AA | AA | A | AA |
| 303 | D | SOFTAZOLINE LPB-R | 5% | A | AA | A | A |
| 304 | E | SOFTAZOLINE LPB-R | 5% | AA | AA | A | AA |
| 305 | F | SOFTAZOLINE LPB-R | 5% | AA | AA | A | AA |
| 306 | G | SOFTAZOLINE LPB-R | 5% | A | AA | AA | A |
| 307 | H | SOFTAZOLINE LPB-R | 5% | AA | AA | AA | AA |
| 308 | I | SOFTAZOLINE LPB-R | 5% | AA | AA | AA | AA |

Example III-4 and Comparative Example III-4

Formation of Recording Layer

The support having thereon the undercoat layer obtained in the above example was provided with a lower layer by coating it with the following coating solution A for lower layer using a wire bar and drying in a 140° C. drying oven for 50 seconds, so as to give a coating amount of 0.85 g/m².

After the lower layer was provided, an upper layer was provided by coating with the following coating solution B for upper layer using a wire bar. After coating, drying was carried out at 140° C. for 60 seconds, thus giving a positive-type lithographic printing plate precursor of Examples and Comparative Examples having a total coating amount for the lower layer and the upper layer of 1.1 g/m².

<Coating Solution A for Lower Layer>

| Polymer A | 2.13 g |
|---|---|
| Surfactant described in Table III-4 | Content described in Table III-4 |

-continued

| | |
|---|---|
| The above-described cyanine dye A | 0.134 g |
| Bis(p-hydroxyphenyl) sulfone | 0.126 g |
| Tetrahydrophthalic Anhydride | 0.19 g |
| p-Toluenesulfonic acid | 0.008 g |
| 2-Methoxy-4-(N-phenylamino) benzene diazonium hexafluorophosphate | 0.032 g |
| Ethyl violet 6-naphthalene sulfonic acid | 0.078 g |
| Fluorine-based surfactant (trade name: Megafac F-780, manufactured by DIC Corporation) | 0.023 g |
| γ-Butyrolactone | 13.16 g |
| Methyl ethyl ketone | 25.39 g |
| 1-Methoxy-2-propanol | 12.95 g |

<Coating Solution B for Upper Layer>

| | |
|---|---|
| m-Cresol/p-Cresol novolac (m/p ratio = 60/40, weight average molecular weight: 4000) | 0.341 g |
| Surfactant described in Table III-4 | Content described in Table III-4 |
| The above-described cyanine dye A | 0.019 g |
| Polymer 1/30% MEK solution (the above structure) | 0.14 g |
| Quaternary ammonium salt (the above structure) | 0.004 g |
| Fluorine-based surfactant (trade name: Megafac F-780, manufactured by DIC Corporation) | 0.004 g |
| Fluorine-based surfactant (trade name: Megafac F-781, manufactured by DIC Corporation) | 0.001 g |
| Methyl ethyl ketone | 2.63 g |
| 1-Methoxy-2-propanol | 5.27 g |

The thus-obtained lithographic printing plate precursor was subjected to the following evaluation. The results are shown in Table III-4.

(Developing Solution)

| | |
|---|---|
| D-Sorbit | 2.5 mass % |
| SOFTAZOLINE LAO (30% solution) | 12 mass % |
| Sodium hydroxide | 0.85 mass % |
| Polyethylene glycol lauryl ether (weight average molecular weight: 1,000) | 0.5 mass % |
| Water | 84.15 mass % |

TABLE III-4

| NO.*[2] III-4 | Surfactant | Content Mass %*[1] | Running residue | Film wearing | Plate durability | Concentration |
|---|---|---|---|---|---|---|
| 401 | SOFTAZOLINE LPB-R | 5% | A | AA | AA | A |
| 402 | SOFTAZOLINE LPB-R | 10% | AA | AA | AA | AA |

Example III-5 and Comparative Example III-5

Support

The surface of the aluminum plate was subjected to an electrolytically roughening treatment with a 2% hydrochloric acid solution. The average roughness Ra was 0.5 μm. Further, the surface of the aluminum plate was anodized in a 20% sulfuric acid aqueous solution thereby obtaining an oxide layer having a coating amount of 2.7 g/m². After that, the aluminum plate was immersed in a 2.5% by weight sodium silicate aqueous solution at 70° C. for 30 minutes, washed and then dried.

(Image Recording Layer)

The following coating solution 1 for lower layer was coated on the substrate obtained as described above, using a bar coater so that the coating weight was 1.5 g/m². The coating was dried at 130° C. for 40 seconds, and then cooled to 35° C. Further, the following coating solution for upper layer was coated thereon using a bar coater so that the coating weight was 0.5 g/m². The coating was dried at 135° C. for 40 seconds, and then gradually cooled to a range of from 20° C. to 26° C. Thus, the lithographic printing plate precursor was obtained.

<Coating Solution 1 for Lower Layer>

| | |
|---|---|
| N-Phenylmaleimide/Methacrylic Acid/Methacrylamide copolymer (mass ratio: 59/15/25, Mw: 50,000) | 5.21 g |
| The above-described cyanine dye A | 0.94 g |
| Crystal Violet | 0.08 g |
| BYK307 (trade name, manufactured by BYK Chemie) | 0.03 g |
| Methyl ethyl ketone | 61.0 g |
| Propylene glycol monomethyl ether | 14.0 g |
| γ-Butyrolactone | 9.40 g |
| Water | 9.34 g |

<Coating Solution 1 for Upper Layer>

| | |
|---|---|
| Polymer A | 7.5 g |
| Surfactant described in Table III-5 | Content described in Table III-5 |
| Ethyl Violet | 0.03 g |
| Crystal Violet | 0.08 g |
| Fluorine-based surfactant (trade name: Megafac F-176, manufactured by DIC Corporation) | 0.05 g |
| 3-Pentanone | 62.50 g |
| Propylene glycol 1-monomethylether-2-acetate | 29.92 g |

The thus-obtained lithographic printing plate precursor was subjected to the following evaluation. The results are shown in Table 5.

(Developing Solution)

| | |
|---|---|
| D-Sorbit | 2.5 mass % |
| NEWCOL B4SN (60% solution) | 7 mass % |
| Sodium hydroxide | 0.85 mass % |
| Polyethylene glycol lauryl ether (weight average molecular weight: 1,000) | 0.5 mass % |
| Water | 89.15 mass % |

TABLE III-5

| NO.*[2] III-5 | Surfactant | Content Mass %*[1] | Running residue | Film wearing | Plate durability | Concentration |
|---|---|---|---|---|---|---|
| 501 | SOFTAZOLINE | 3% | B | AA | AA | B |
| 502 | LAO | 5% | A | AA | AA | A |
| 503 | | 10% | AA | AA | AA | AA |
| 504 | | 15% | AA | A | B | AA |
| 505 | | 20% | AA | B | B | AA |
| 506 | NEWCOL | 3% | B | AA | AA | B |
| 507 | B4SN | 5% | AA | AA | AA | A |
| 508 | | 10% | AA | AA | A | A |
| 509 | | 15% | AA | AA | B | A |
| 510 | | 20% | AA | B | B | A |
| c51 | None | None | C | AA | AA | C |
| c52 | Triethanolamine | 5% | C | AA | AA | D |
| c53 | | 10% | C | AA | AA | D |

As is apparent from the above, the lithographic printing plate precursors of the present invention drastically improve the running residue and have satisfactory performances without the film wearing, and also exhibit high-plate durability. From these results, it is seen that the lithographic printing plate precursors having the recording layer that contains the amphoteric surfactant or the anionic surfactant according to the present invention make it possible to realize good developability in addition to high-plate durability.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2011-081065 filed in Japan on Mar. 31, 2011, Patent Application No. 2011-081066 filed in Japan on Mar. 31, 2011, Patent Application No. 2011-081067 filed in Japan on Mar. 31, 2011, Patent Application No. 2012-016694 filed in Japan on Jan. 30, 2012, and Patent Application No. 2012-018134 filed in Japan on Jan. 31, 2012, each of which is entirely herein incorporated by reference.

What we claim is:

1. A positive lithographic printing plate precursor with an infrared-sensitivity, having a support and an image recording layer provided on the support, the support having a hydrophilic surface, the recording layer comprising:
   a maleimide resin A;
   an amphoteric surfactant and/or an anionic surfactant; and
   an infrared absorbing agent;
   the maleimide resin A being a copolymer formed from monomers containing:
   methacrylic acid;
   at least one kind of compound selected from the group consisting of N-phenylmaleimide, N-cyclohexylmaleimide and N-benzylmaleimide; and
   a monomer having a structure represented by formula (A):

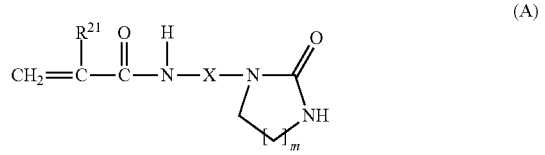

(A)

wherein $R^{21}$ represents a hydrogen atom or a methyl group; X represents an alkylene group having 2 to 12 carbon atoms, an oxyalkylene group having 4 to 8 carbon atoms or —$SiRa_2$—; Ra represents an alkyl group and the two (2) alkyl groups represented by Ra may be the same as or different from each other; and m represents an integer of 1 to 3.

2. The lithographic printing plate precursor according to claim 1, wherein the image recording layer has a configuration in which a lower layer on the side of the support and an upper layer on the side opposite thereto are disposed on the support in this order, the upper layer and/or the lower layer comprising the maleimide resin A, the amphoteric surfactant and/or the anionic surfactant, and the infrared absorbing agent in the same layer, or in a separate layer.

3. The lithographic printing plate precursor according to claim 1, wherein the amphoteric surfactant is represented by any one of formulae (I) to (III):

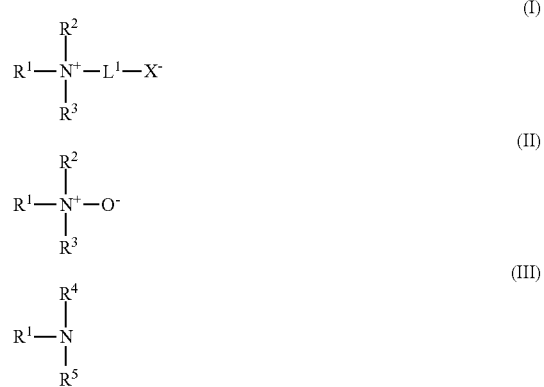

wherein $R^1$ represents an alkyl group having 6 to 24 carbon atoms or an alkyl group through a particular connecting group; $R^2$ and $R^3$ each independently represent an alkyl group having 1 to 5 carbon atoms; $R^4$ and $R^5$ each independently represent an alkyl group having 1 to 5 carbon atoms, and at least one of $R^4$ and $R^5$ contains an acidic group or a salt thereof at the end of the alkyl group; $L^1$ represents a linking group having 1 to 4 carbon atoms; and $X^-$ represents a carboxylate ion, a sulfonate ion, a sulfate ion or a phosphate ion.

4. The lithographic printing plate precursor according to claim 1, wherein the anionic surfactant is represented by any one of formulae (IV) to (VI):

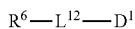 (IV)

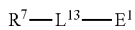 (V)

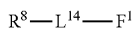 (VI)

wherein $R^6$ represents an alkyl group having 6 to 24 carbon atoms; $L^{12}$ represents a phenylene group or a single bond; $D^1$, $E^1$ and $F^1$ each represent an sulfonate ion or a salt thereof, or an phosphate ion or a salt thereof; $R^7$ represents an alkyl group having 4 to 18 carbon atoms; $L^{13}$ represents a phenylene group or a naphthylene group; $R^8$ represents a phenyl group or a naphthyl group; and $L^{14}$ represents a polyalkyleneoxy group.

5. The lithographic printing plate precursor according to claim 2, wherein the surfactant is contained in an amount of 1% by mass or more and less than 20% by mass with respect to the total amount of the solid content of the layer containing the same, and the surfactant and the infrared absorbing agent are contained in the same layer, or in a separate layer.

6. The lithographic printing plate precursor according to claim 1, wherein the surfactant is contained in an amount of from 0.5% by mass to 40% by mass with respect to 100% by mass of the maleimide resin A.

7. The lithographic printing plate precursor according to claim 1, wherein the lithographic printing plate precursor has an undercoat layer, a lower layer for forming the recording layer and an upper layer for forming the recording layer in this order as layers on the support.

8. The lithographic printing plate precursor according to claim 2, wherein the maleimide resin A is contained in the lower layer of the recording layer.

9. The lithographic printing plate precursor according to claim 2, wherein the surfactant is contained in the same layer as the layer containing the maleimide resin A.

10. A method of making a lithographic printing plate, comprising, in the following order:
    subjecting the recording layer of the lithographic printing plate precursor according to claim 1 to image-wise exposure; and
    developing the lithographic printing plate precursor using an alkaline aqueous solution which has a pH of from 11.0 to 13.5.

11. The method of making a lithographic printing plate according to claim 10, wherein the aqueous alkali solution comprises an anionic surfactant or a nonionic surfactant.

* * * * *